(12) United States Patent
Lin et al.

(10) Patent No.: US 12,354,633 B2
(45) Date of Patent: Jul. 8, 2025

(54) SPACER FILM SCHEME FORM POLARIZATION IMPROVEMENT

(71) Applicant: Taiwan Semiconductor Manufacturing Company, Ltd., Hsinchu (TW)

(72) Inventors: Tzu-Yu Lin, Taoyuan (TW); Yao-Wen Chang, Taipei (TW)

(73) Assignee: Taiwan Semiconductor Manfacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/763,154

(22) Filed: Jul. 3, 2024

(65) Prior Publication Data
US 2024/0355358 A1   Oct. 24, 2024

Related U.S. Application Data

(63) Continuation of application No. 18/150,281, filed on Jan. 5, 2023, now Pat. No. 12,119,035.

(60) Provisional application No. 63/412,969, filed on Oct. 4, 2022, provisional application No. 63/393,347, filed on Jul. 29, 2022.

(51) Int. Cl.
  G11B 9/02  (2006.01)
  H10B 51/30 (2023.01)

(52) U.S. Cl.
  CPC .............. G11B 9/02 (2013.01); H10B 51/30 (2023.02)

(58) Field of Classification Search
  CPC .......... G11B 9/02; H10B 51/30; H10B 53/30; H10B 53/20; G11C 11/221; H01L 28/55; H01L 29/4983
  See application file for complete search history.

(56) References Cited

U.S. PATENT DOCUMENTS

| | | | |
|---|---|---|---|
| 2008/0061285 A1* | 3/2008 | Arghavani | H10D 30/794 438/285 |
| 2009/0108378 A1* | 4/2009 | Zhu | H10D 30/792 257/E21.409 |
| 2017/0338350 A1 | 11/2017 | Flachowsky et al. | |
| 2018/0358380 A1 | 12/2018 | Yoo | |
| 2019/0131425 A1 | 5/2019 | Lu et al. | |
| 2021/0335799 A1 | 10/2021 | Lee et al. | |
| 2021/0343856 A1 | 11/2021 | Haratipour et al. | |
| 2022/0157852 A1 | 5/2022 | Prasad et al. | |
| 2022/0285519 A1* | 9/2022 | Huang | H10D 30/0415 |

(Continued)

OTHER PUBLICATIONS

Notice of Allowance dated Jun. 21, 2024 for U.S. Appl. No. 18/150,281.

*Primary Examiner* — Andrew Sasinowski
(74) *Attorney, Agent, or Firm* — Eschweiler & Potashnik, LLC

(57) ABSTRACT

The present disclosure relates to an integrated chip. The integrated chip includes a lower electrode disposed within a dielectric structure over a substrate. A ferroelectric data storage structure is disposed over the lower electrode and an upper electrode is disposed over the ferroelectric data storage structure. One or more stressed sidewall spacers are arranged on opposing sides of the upper electrode. The ferroelectric data storage structure has an orthorhombic phase concentration that varies from directly below the one or more stressed sidewall spacers to laterally outside of the one or more stressed sidewall spacers.

20 Claims, 18 Drawing Sheets

(56) References Cited

U.S. PATENT DOCUMENTS

2023/0363174 A1    11/2023    Yamazaki et al.
2024/0130136 A1*    4/2024    Song .................. H10B 51/20

\* cited by examiner

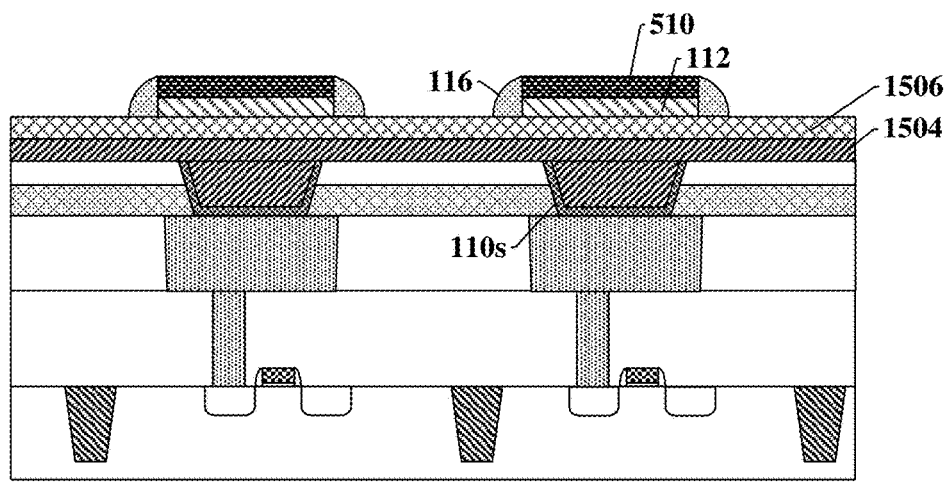
Fig. 18A
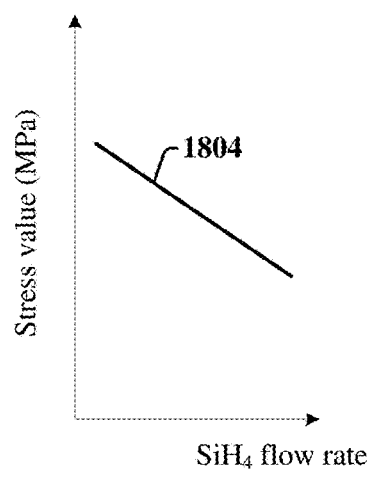 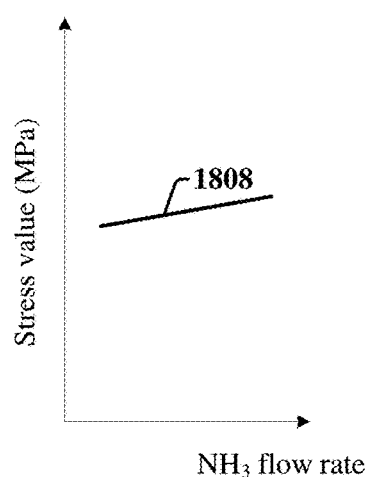 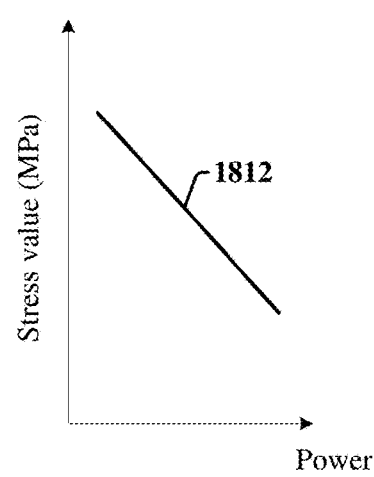
Fig. 18B    Fig. 18C    Fig. 18D

SPACER FILM SCHEME FORM POLARIZATION IMPROVEMENT

REFERENCE TO RELATED APPLICATIONS

This application is a Continuation of U.S. application Ser. No. 18/150,281, filed on Jan. 5, 2023, which contains the benefit of U.S. Provisional Application No. 63/393,347, filed on Jul. 29, 2022 & U.S. Provisional Application No. 63/412,969, filed on Oct. 4, 2022. The contents of the above-referenced patent applications are hereby incorporated by reference in their entirety.

BACKGROUND

Many modern-day electronic devices contain electronic memory configured to store data. Electronic memory may be volatile memory or non-volatile memory. Volatile memory stores data when it is powered, while non-volatile memory is able to store data when power is removed. Ferroelectric random-access memory (FeRAM) devices are one promising candidate for a next generation non-volatile memory technology. This is because FeRAM devices provide for many advantages, including a fast write time, a high endurance, a low power consumption, and a low susceptibility to damage from radiation.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 11-22 illustrate some embodiments of a method of forming an IC having a ferroelectric memory device including one or more stressed sidewall spacers configured to affect an orthorhombic phase concentration within a ferroelectric data storage structure.

DETAILED DESCRIPTION

Figure 1:
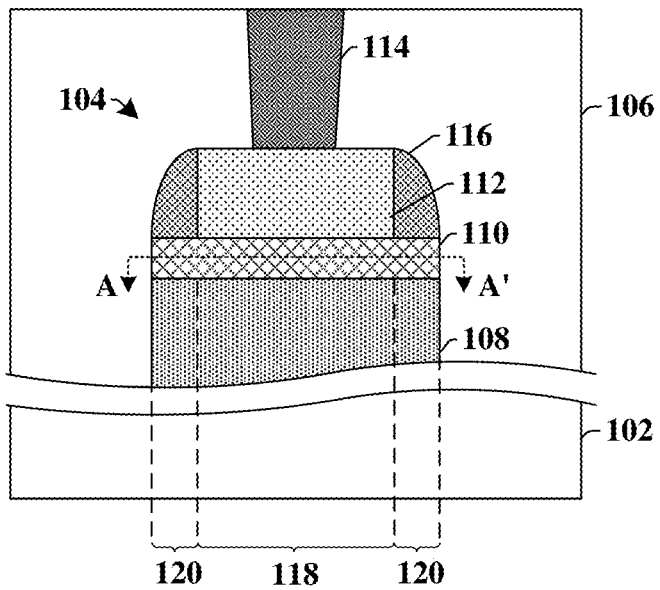
FIG. 1 illustrates a cross-sectional view of some embodiments of an integrated chip (IC) having a ferroelectric memory device including one or more stressed sidewall spacers configured to affect an orthorhombic phase concentration within a ferroelectric data storage structure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Ferroelectric random-access memory (FeRAM) devices have a first electrode that is separated from a second electrode by a ferroelectric data storage structure comprising a ferroelectric material. The ferroelectric material has an intrinsic electric dipole that can be switched between opposite polarities by application of an external electric field. The different polarities provide the FeRAM device with different capacitances, which can be sensed during a read operation by a voltage on a bit-line. The different capacitances are representative of different data states (e.g., a logical '0' or '1'), thereby allowing the FeRAM device to digitally store data.

It has been appreciated that some ferroelectric materials (e.g., hafnium zirconium oxide) used within a ferroelectric data storage structure may be fabricated to have a plurality of different crystalline phases (e.g., monoclinic, tetragonal, and/or orthorhombic phases) due to an influence of an underlying lower electrode. It has been further appreciated that ferroelectric memory devices having a ferroelectric data storage structure material with a high orthorhombic phase concentration will have large memory windows (e.g., a difference in voltages on a bit-line between a low data state corresponding to a logical "0" and a high data state corresponding to a logical "1"). For example, a ferroelectric memory device having a ferroelectric material that is 78% monoclinic phase, 17% orthorhombic phase, and 5% tetragonal phase may have a memory window of 0.2 volts (V), while a ferroelectric memory device having a ferroelectric material that is 16% monoclinic phase, 62% orthorhombic phase, and 22% tetragonal phase may have a memory window of 0.7 V. Therefore, a ferroelectric memory device having a ferroelectric material with a low orthorhombic phase may have a relatively small memory window, which makes it difficult to differentiate between different data states during a read operation.

The present disclosure, in some embodiments, relates to an integrated chip having a ferroelectric memory device including one or more stressed sidewall spacers configured to increase an orthorhombic phase concentration within parts of a ferroelectric data storage structure. The integrated chip includes a ferroelectric data storage structure disposed between a lower electrode and an upper electrode. One or more stressed sidewall spacers are arranged on opposing sides of the upper electrode and over one or more peripheral regions of the ferroelectric data storage structure. The one or more stressed sidewall spacers are configured to increase an orthorhombic phase concentration within the one or more peripheral regions of the ferroelectric data storage structure during fabrication of the ferroelectric memory device. The increased orthorhombic phase concentration within the one or more peripheral regions of the ferroelectric data storage structure can increase a memory window size (e.g., a read window size) of the ferroelectric memory device, thereby improving a performance of the integrated chip.

FIG. 1 illustrates a cross-sectional view of some embodiments of an integrated chip 100 having a ferroelectric memory device including one or more stressed sidewall spacers configured to affect an orthorhombic phase concentration within a ferroelectric data storage structure.

The integrated chip 100 comprises a ferroelectric memory device 104 disposed within a dielectric structure 106 (e.g., an inter-level dielectric (ILD) structure) over a substrate 102. The ferroelectric memory device 104 comprises a ferroelectric data storage structure 110 arranged between a lower electrode 108 and an upper electrode 112. The ferroelectric data storage structure 110 is configured to change polarization based upon one or more voltages applied to the lower electrode 108 and/or the upper electrode 112. An upper interconnect structure 114 extends through the dielectric structure 106 to contact the upper electrode 112.

One or more stressed sidewall spacers 116 are arranged over the ferroelectric data storage structure 110 and along opposing sides of the upper electrode 112. In some embodiments, the one or more stressed sidewall spacers 116 may physically contact an upper surface of the ferroelectric data storage structure 110. In various embodiments, the one or more stressed sidewall spacers 116 may have a stress that comprises a tensile stress or a compressive stress. In some embodiments, the stress may be in a range of between approximately 50 MPa (megapascals) and approximately 1200 MPa, between approximately 100 MPa and approximately 1000 MPa, between approximately 200 MPa and approximately 600 MPa, between approximately 400 MPa and approximately 500 MPa, or other similar values.

The ferroelectric data storage structure 110 comprises a central region 118 disposed directly below the upper electrode 112 and one or more peripheral regions 120 arranged directly below the one or more stressed sidewall spacers 116. The one or more peripheral regions 120 laterally surround the central region 118. During fabrication of the ferroelectric memory device 104, the one or more stressed sidewall spacers 116 are configured to influence a crystal phase (i.e., a crystal structure) within the one or more peripheral regions 120 of the ferroelectric data storage structure 110. For example, after forming the one or more stressed sidewall spacers 116 onto the ferroelectric data storage structure 110, an anneal process may be performed. Because of the stress of the one or more stressed sidewall spacers 116, the anneal process causes non-orthorhombic phases (i.e., non-orthorhombic crystal phases) within the one or more peripheral regions 120 of the ferroelectric data storage structure 110 to be transformed to an orthorhombic phase (e.g., a polar orthorhombic phase, a polar orthorhombic phase with space group $Pca2_1$, or the like).

As a result of the one or more stressed sidewall spacers 116 increasing an orthorhombic phase concentration within the one or more peripheral regions 120, the central region 118 of the ferroelectric data storage structure 110 has a first orthorhombic phase concentration (e.g., a first polar orthorhombic phase concentration) and the one or more peripheral regions 120 have a second orthorhombic phase concentration (e.g., a second polar orthorhombic phase concentration) that is greater than the first orthorhombic phase concentration. The increased orthorhombic phase concentration within the one or more peripheral regions 120 causes an overall orthorhombic phase concentration of the ferroelectric data storage structure 110 to be relatively high. The relatively high orthorhombic phase concentration of the ferroelectric data storage structure 110 increases a memory window size (e.g., a read window size) of the ferroelectric memory device 104, thereby improving a performance of the integrated chip 100.

Figure 2:
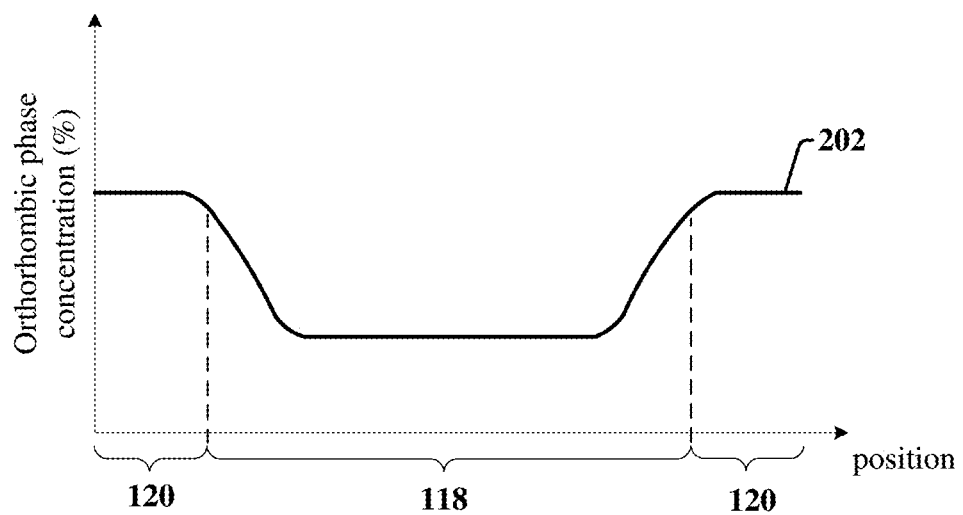
FIG. 2 illustrates a graph showing some embodiments of an orthorhombic phase concentration within a central region and within one or more peripheral regions of a disclosed ferroelectric data storage structure.

FIG. 2 illustrates a graph 200 showing some embodiments of an orthorhombic phase concentration within a ferroelectric data storage structure. As shown in graph 200, a position within the ferroelectric data storage structure is illustrated along an x-axis and an orthorhombic phase concentration is shown along a y-axis.

The ferroelectric data storage structure comprises a central region 118 directly below an upper electrode and one or more peripheral regions 120 directly below one or more stressed sidewall spacers. The one or more peripheral regions 120 laterally surround the central region 118. An orthorhombic phase concentration 202 (e.g., a percentage of orthorhombic phase, a percentage of polar orthorhombic phase, etc.) varies between the central region 118 and the one or more peripheral regions 120. In some embodiments, the orthorhombic phase concentration 202 may also vary within the central region 118 and the one or more peripheral regions 120.

In some embodiments, the orthorhombic phase concentration 202 is larger within the one or more peripheral regions 120 than within the central region 118. In some embodiments, the orthorhombic phase concentration 202 within the central region 118 has a maximum orthorhombic phase concentration of greater than approximately 40%, greater than approximately 45%, or other similar values. In some embodiments, the orthorhombic phase concentration 202 within the one or more peripheral regions 120 has a maximum orthorhombic phase concentration of greater than approximately 70%, greater than approximately 75%, or other similar values. In some embodiments, a maximum orthorhombic phase concentration within the one or more peripheral regions 120 is more than 30% larger than a maximum orthorhombic phase concentration within the central region 118. In some embodiments, the orthorhombic phase concentration may be measured by precession electron diffusion (PED) analysis.

In some embodiments, the one or more stressed sidewall spacers may improve a uniformity of the orthorhombic phase concentration between the central region 118 and the one or more peripheral regions 120 relative to a ferroelectric memory device having unstressed sidewalls spacers. For example, the one or more stressed sidewall spacers may cause the orthorhombic phase concentration to vary by approximately 30% or less between the central region 118 and the one or more peripheral regions 120. Improving the uniformity of the orthorhombic phase concentration between the central region 118 and the one or more peripheral regions 120 further improves a performance of a disclosed ferroelectric memory device. Moreover, improving the uniformity of the orthorhombic phase concentration between the central region 118 and the one or more peripheral regions 120 can reduce device-to-device variations over a memory array and thereby improve a reliability of read operations on the memory array.

Figure 3:
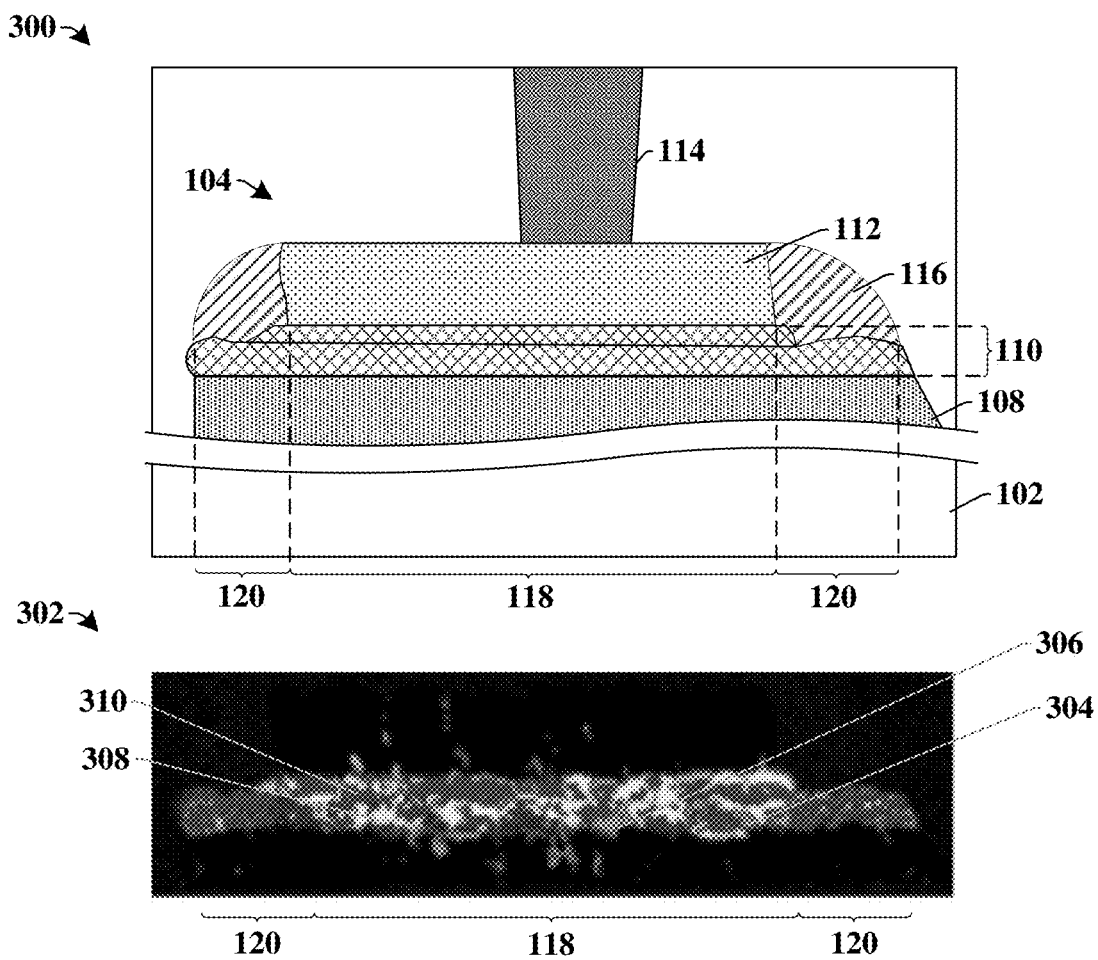
FIG. 3 illustrates some embodiments of a ferroelectric memory device having one or more stressed sidewall spacers and a corresponding crystal phase mapping of a ferroelectric data storage structure within the ferroelectric memory device.

FIG. 3 illustrates a cross-sectional view of some embodiments of an integrated chip 300 including a ferroelectric memory device 104 having one or more stressed sidewall spacers and an exemplary corresponding crystal phase mapping 302 of a ferroelectric data storage structure within the ferroelectric memory device 104.

The ferroelectric memory device 104 comprises a ferroelectric data storage structure 110 disposed between a lower electrode 108 and an upper electrode 112. One or more stressed sidewall spacers 116 are arranged on opposing sides of the upper electrode 112. The ferroelectric data storage structure 110 comprises a central region 118 and one or more peripheral regions 120 laterally surrounding the central region 118.

As shown in the crystal phase mapping 302, both the central region 118 and the one or more peripheral regions 120 of the ferroelectric data storage structure comprise a plurality of segments having different crystal phases. For example, the ferroelectric data storage structure may comprise segments having a monoclinic phase 304, a tetragonal phase 306, a polar orthorhombic phase (P29) 308, and a non-polar orthorhombic phase (P61) 310. In some embodiments, the one or more peripheral regions 120 have a polar orthorhombic phase concentration that is higher than a non-polar orthorhombic phase concentration.

In some embodiments, the central region 118 may have a polar orthorhombic phase (P29) concentration that is between approximately 40% and approximately 50%, that is approximately 45%, or other similar values. In some embodiments, the one or more peripheral regions 120 may have polar orthorhombic crystalline phase (P29) concentration that is between approximately 70% and approximately 80%, that is approximately 77%, or other similar values. In some embodiments, an imaginary vertically extending line may extend through segments of the ferroelectric data storage structure having two or more different crystal phases. In some additional embodiments, an imaginary horizontally extending line may extend through segments of the ferroelectric data storage structure having two or more different crystal phases.

Figure 4:
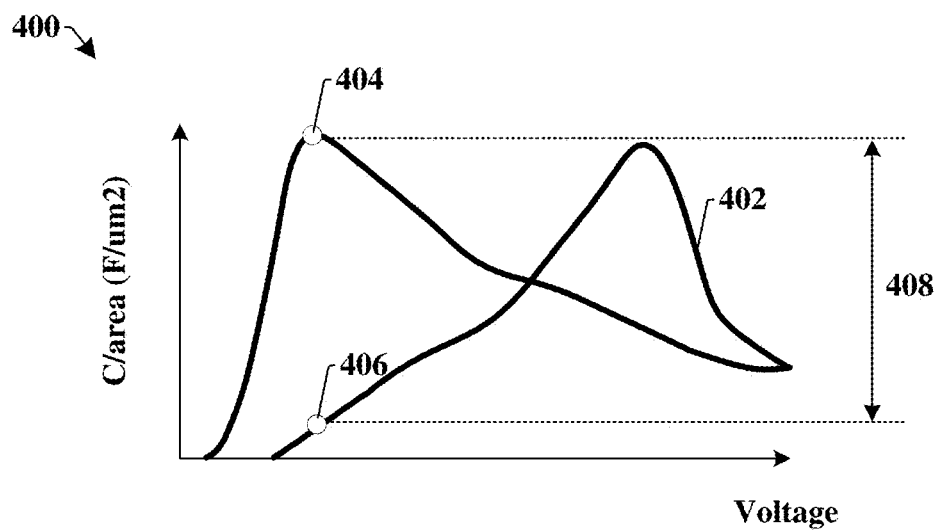
FIG. 4 illustrates some embodiments of a capacitance vs. voltage graph for a disclosed ferroelectric memory device having one or more stressed sidewall spacers.

FIG. 4 illustrates some embodiments of a graph 400 showing capacitance vs. voltage for a disclosed ferroelectric memory device having one or more stressed sidewall spacers.

As shown in graph 400, a voltage applied to a disclosed ferroelectric memory device is illustrated along an x-axis and a corresponding capacitance associated with the ferroelectric memory device is shown along a y-axis. The capacitance associated with the ferroelectric memory device follows a hysteresis curve 402 as a voltage changes. A first data state (e.g., a logical '0') may be associated with a first capacitance value 404 measured at a first position within the hysteresis curve 402 and a second data state (e.g., a logical '1') may be associated with a second capacitance value 406 measured at a second position within the hysteresis curve 402.

A read window 408 is a difference between the first capacitance value 404 and the second capacitance value 406. In some embodiments, the read window 408 of the disclosed ferroelectric memory device may be greater than approximately 0.5 $fF/um^2$ (femtofarad/micron$^2$), greater than or equal to approximately 0.55 $fF/um^2$, approximately 0.58 $fF/um^2$, or other similar values. In some embodiments, the disclosed ferroelectric memory device may have a read window (e.g., 408) that is more than 20% larger than that of a ferroelectric memory device not having the one or more stressed sidewall spacers. In some additional embodiments, the disclosed ferroelectric memory device may have a read window (e.g., 408) that is more than 50% larger than that of a ferroelectric memory device not having the one or more stressed sidewall spacers.

In addition to improving a read window of a disclosed ferroelectric memory device, it has also been appreciated that the one or more stressed sidewall spacers may also mitigate breakdown due to cycling. For example, an increase in leakage current of the disclosed ferroelectric memory device will be smaller than that of a ferroelectric memory device not having the one or more stressed sidewall spacers for a given number of cycles (e.g., read and/or write operations). The higher resistance to breakdown due to cycling increases a reliability of the disclosed ferroelectric memory device.

Figure 5:
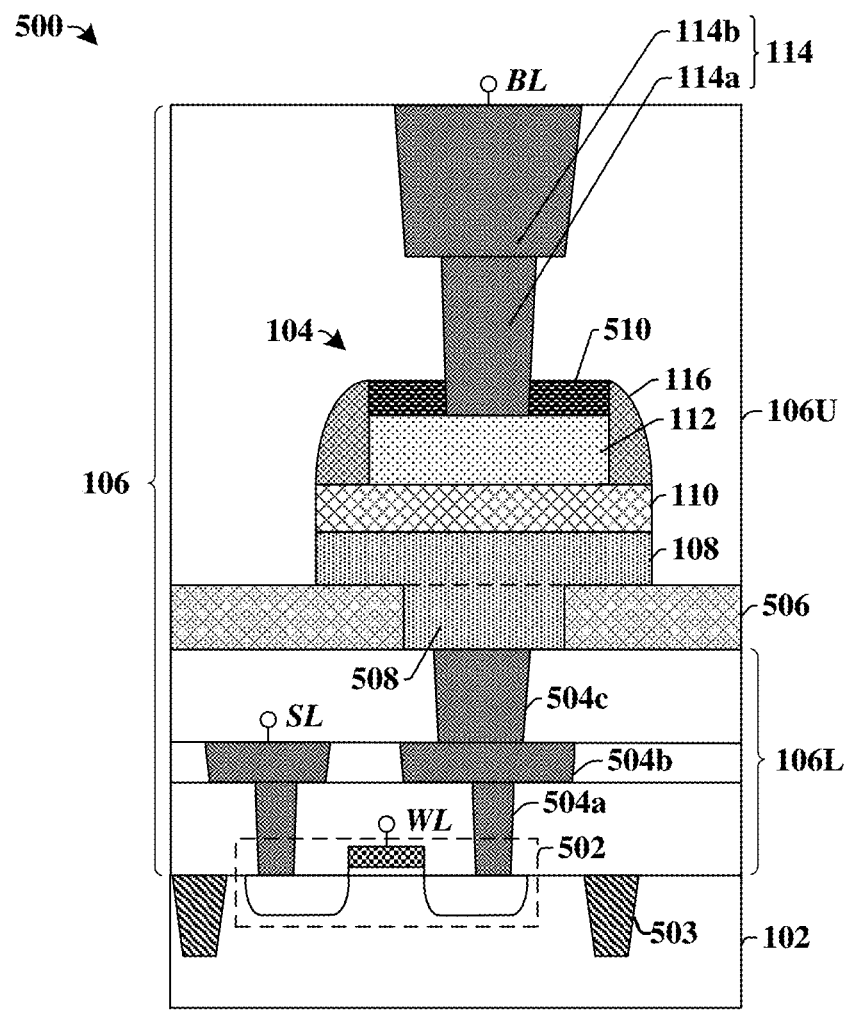
FIG. 5 illustrates a cross-sectional view of some additional embodiments of an IC having a ferroelectric memory device including one or more stressed sidewall spacers.

FIG. 5 illustrates a cross-sectional view of some additional embodiments of an integrated chip 500 having a ferroelectric memory device including one or more stressed sidewall spacers.

The integrated chip 500 includes a ferroelectric memory device 104 disposed within a dielectric structure 106 over a substrate 102. In some embodiments, the dielectric structure 106 may comprise a lower dielectric structure 106L arranged between the ferroelectric memory device 104 and the substrate 102, and an upper ILD layer 106U surrounding the ferroelectric memory device 104. In some embodiments, the lower dielectric structure 106L surrounds one or more lower interconnects 504a-504c. In some embodiments, the upper ILD layer 106U surrounds an upper interconnect structure 114. In some embodiments, the one or more lower interconnects 504a-504c may comprise a conductive contact, an interconnect wire, and/or an interconnect via. In some embodiments, the upper interconnect structure 114 may comprise an interconnect via 114a (e.g., a top electrode via (TEVA)) and/or an interconnect wire 114b. In some embodiments, the lower dielectric structure 106L surrounds more layers of interconnect wires.

In some embodiments, the one or more lower interconnects 504a-504c may couple the ferroelectric memory device 104 to an access device 502. In various embodiments, the access device 502 may comprise a unipolar selector (e.g., a diode), a bipolar selector (e.g., a transistor device disposed on and/or within the substrate 102), or the like. In some embodiments, the access device 502 may comprise a planar FET, a FinFET, a gate all around (GAA) transistor, a nanosheet transistor, or the like. In some embodiments, one or more isolation structures 503 (e.g., shallow trench isolation (STI) structures) may be disposed within the substrate 102 on opposing sides of the access device 502. In some embodiments, the one or more lower interconnects 504a-504c may further couple the access device 502 to a source-line SL and a word-line WL. In some embodiments, the upper interconnect structure 114 may couple the ferroelectric memory device 104 to a bit-line BL.

In some embodiments, the one or more lower interconnects 504a-504c and the upper interconnect structure 114 may comprise tungsten, aluminum, copper, ruthenium, and/or the like. In some embodiments, the dielectric structure 106 may comprise a nitride (e.g., silicon nitride, silicon oxynitride), a carbide (e.g., silicon carbide), an oxide (e.g., silicon oxide), borosilicate glass (BSG), phosphoric silicate glass (PSG), borophosphosilicate glass (BPSG), a low-k oxide (e.g., a carbon doped oxide, SiCOH), and/or the like.

In some embodiments, a lower insulating structure 506 is disposed over the lower dielectric structure 106L. The lower insulating structure 506 comprises one or more sidewalls that form an opening disposed over the one or more lower interconnects 504a-504c. In some embodiments, a lower electrode via 508 extends through the opening within the lower insulating structure 506. The lower electrode via 508 couples the ferroelectric memory device 104 to the one or more lower interconnects 504a-504c.

The ferroelectric memory device 104 is disposed over the lower insulating structure 506 and the lower electrode via 508. The ferroelectric memory device 104 comprises a ferroelectric data storage structure 110 disposed between a lower electrode 108 and an upper electrode 112. The lower electrode 108 may comprise a first metal and the upper electrode 112 may comprise a second metal. In some embodiments, the first metal and/or the second metal may comprise tungsten, tantalum, titanium, tantalum nitride, titanium nitride, ruthenium, platinum, iridium, molybdenum, or the like. The ferroelectric data storage structure 110 comprises a high-k dielectric material, such as hafnium oxide (e.g., $HfO_2$), hafnium zirconium oxide (e.g., $HfZrO_2$), zirconium oxide (e.g., $ZrO_2$), and/or the like. In some embodiments, the lower electrode 108 and the upper electrode 112 may have heights that are between approximately 100 Angstroms (Å) and approximately 1000 Å, between approximately 100 Å and approximately 500 Å, or other similar values.

One or more stressed sidewall spacers 116 are disposed along opposing sides of the upper electrode 112. In some embodiments, the one or more stressed sidewall spacers 116 may comprise silicon nitride, silicon carbon nitride, aluminum nitride, or the like. In some embodiments, the one or more stressed sidewall spacers 116 may have a height that is between approximately 100 Å and approximately 2000 Å, between approximately 100 Å and approximately 100 Å, between approximately 100 Å and approximately 500 Å, or other similar values.

In some embodiments, a hard mask 510 is disposed over the upper electrode 112. In some such embodiments, the one or more stressed sidewall spacers 116 may be disposed along opposing sides of the upper electrode 112 and the hard mask 510. In some embodiments, the one or more stressed sidewall spacers 116 may comprise a same material as the hard mask 510. For example, the one or more stressed sidewall spacers 116 and the hard mask 510 may comprise a carbide (e.g., silicon carbide), a nitride (e.g., silicon nitride), an oxide (e.g., silicon oxy-nitride), or the like. In other embodiments, the one or more stressed sidewall spacers 116 may comprise a different material than the hard mask 510. In some embodiments, the one or more stressed sidewall spacers 116 and the hard mask 510 may extend to different heights over the substrate 102 (e.g., the hard mask 510 may have a top surface that is recessed below a top surface of the one or more stressed sidewall spacers 116, or vice versa).

During operation, one or more bias voltages may be applied to the lower electrode 108 and/or the upper electrode 112. For example, during a write operation, one or more bias voltages can be applied to the lower electrode 108 and/or the upper electrode 112 to cause charge carriers (e.g., electrons and/or holes) to accumulate in the lower electrode 108 and/or the upper electrode 112. The charge carriers generate electric fields, which extend through the ferroelectric data storage structure 110. The electric fields are configured to change positions of electric dipoles within the ferroelectric data storage structure 110 depending on the bias voltages. If the positions of electric dipoles within the ferroelectric data storage structure 110 define a first polarization, the ferroelectric memory device 104 will digitally store data as a first bit value (e.g., a logical "0"). Alternatively, if the positions of electric dipoles within the ferroelectric data storage structure 110 define a second polarization, the ferroelectric memory device 104 will digitally store data as a second bit value (e.g., a logical "1").

Figure 6A:
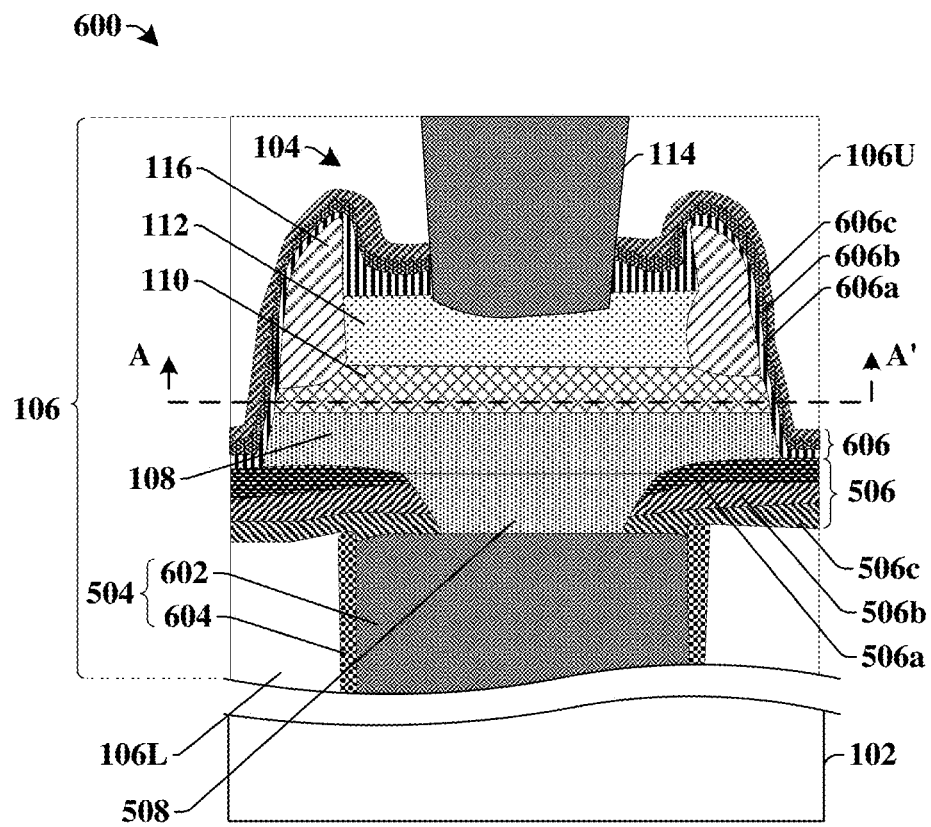
FIGS. 6A-6B illustrate some additional embodiments of an IC having a ferroelectric memory device including one or more stressed sidewall spacers.

FIG. 6A illustrates a cross-sectional view of some additional embodiments of an integrated chip 600 having a ferroelectric memory device including one or more stressed sidewall spacers.

The integrated chip 600 comprises a ferroelectric memory device 104 disposed within a dielectric structure 106 over a substrate 102. The ferroelectric memory device 104 comprises a ferroelectric data storage structure 110 arranged between a lower electrode 108 and an upper electrode 112. The dielectric structure 106 comprises a lower dielectric structure 106L separated from an upper ILD layer 106U by a lower insulating structure 506. The lower dielectric structure 106L surrounds a lower interconnect 504. In some embodiments, the lower interconnect 504 may comprise a conductive core 602 surrounded by a barrier 604. The conductive core 602 may comprise a metal, such as copper, aluminum, tungsten, and/or the like. The barrier 604 may comprise a metal-nitride such as titanium, tantalum, titanium nitride, tantalum-nitride, and/or the like.

In some embodiments, the lower insulating structure 506 may comprise a plurality of dielectric materials stacked onto one another. For example, the lower insulating structure 506 may comprise one or more of silicon nitride, silicon dioxide, silicon carbide, Tetraethyl orthosilicate (TEOS), or the like. In some embodiments, the lower insulating structure 506 comprises a first lower insulating layer 506a, a second lower insulating layer 506b over the first lower insulating layer 506a, and a third lower insulating layer 506c over the second lower insulating layer 506b. A lower electrode via 508 extends through the lower insulating structure 506. The lower electrode via 508 couples the lower interconnect 504 to the ferroelectric memory device 104.

A protective structure 606 is arranged on the ferroelectric memory device 104 and the lower insulating structure 506. In some embodiments, the protective structure 606 may comprise one or more of an oxide (e.g., silicon rich oxide, silicon dioxide, etc.), a nitride (e.g., silicon nitride, silicon oxynitride, etc.), a carbide (e.g., silicon carbide, silicon oxycarbide, etc.), or the like. In some embodiments, the protective structure 606 comprises a first protective layer 606a, a second protective layer 606b over the first protective layer 606a, and a third protective layer 606c over the second protective layer 606b. An upper interconnect structure 114 is disposed within the upper ILD layer 106U. The upper interconnect structure 114 extends from an upper surface of the upper ILD layer 106U, through the protective structure 606, and to the ferroelectric memory device 104.

Figure 6B:
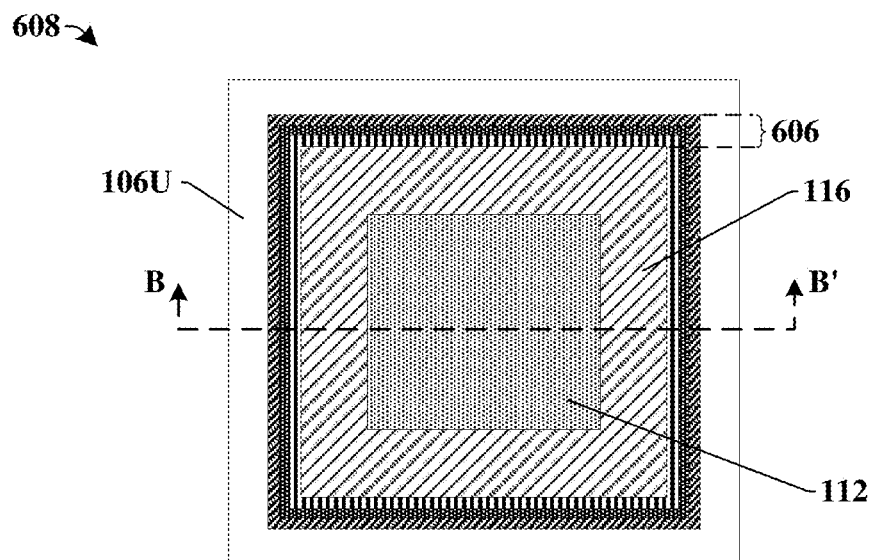

FIG. 6B illustrates a top-view 608 of the integrated chip 600 of FIG. 6A. In some embodiments, the cross-sectional view shown in FIG. 6A may be taken along line B-B' of FIG. 6B. In some embodiments, the top-view 608 shown in FIG. 6B may be taken along line A-A' of FIG. 6A.

As shown in top-view 608, the one or more sidewall spacers 116 extend in a closed and unbroken path around the upper electrode 112, the protective structure 606 extends in a closed and unbroken path around the upper electrode 112, and the upper ILD layer 106U extends in a closed and unbroken path around the protective structure 606.

Figure 7:
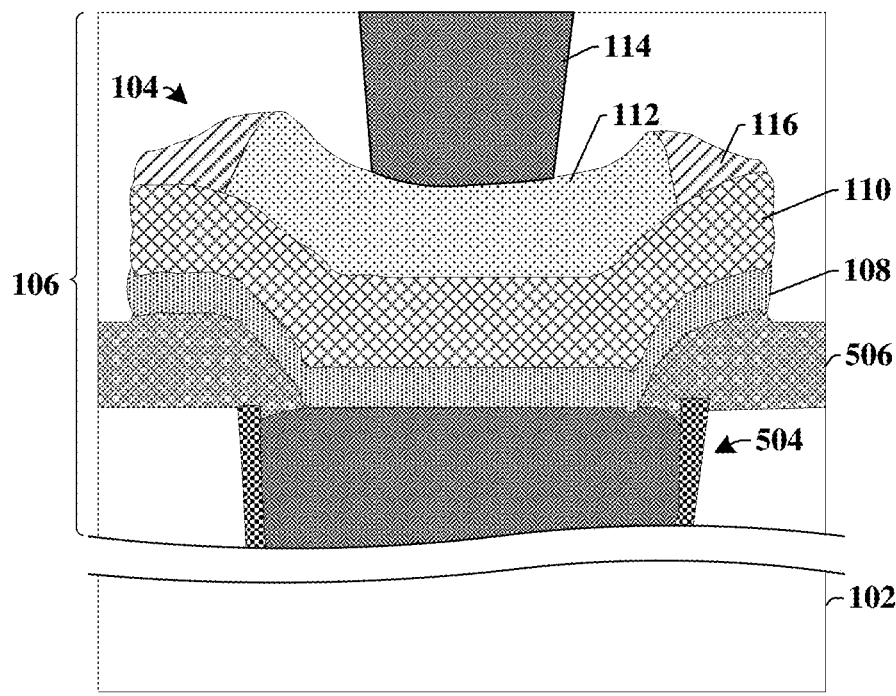
FIG. 7 illustrates a cross-sectional view of some additional embodiments of an IC having a ferroelectric memory device including one or more stressed sidewall spacers.

FIG. 7 illustrates a cross-sectional view of some additional embodiments of an integrated chip 700 having a ferroelectric memory device including one or more stressed sidewall spacers.

The integrated chip 700 comprises a lower interconnect 504 disposed within a dielectric structure 106 over a substrate 102. A lower insulating structure 506 is disposed over the lower dielectric structure 106L and the lower interconnect 504. A ferroelectric memory device 104 is disposed over the lower insulating structure 506. The ferroelectric memory device 104 comprises a ferroelectric data storage structure 110 disposed between a lower electrode 108 and an upper electrode 112. One or more stressed sidewall spacers 116 are disposed along opposing sides of the upper electrode 112. In some embodiments, the one or more stressed sidewall spacers 116 are disposed over a topmost point of the ferroelectric data storage structure 110 that is laterally outside of the upper electrode 112. In some embodiments, the ferroelectric data storage structure 110 has a substantially uniform thickness between opposing outermost sidewalls of the ferroelectric data storage structure 110.

In some embodiments, the lower electrode 108, the ferroelectric data storage structure 110, and the upper electrode 112 are conformal layers (e.g., that respectively have a substantially V shaped structure). In some such embodiments, the lower electrode 108 lines one or more sidewalls of the lower insulating structure 506 and has angled interior sidewalls that define a first recess within an upper surface of the lower electrode 108. The ferroelectric data storage structure 110 lines the angled interior sidewalls of the lower electrode 108 and has angled interior sidewalls that define a second recess within an upper surface of the ferroelectric data storage structure 110. The upper electrode 112 lines the angled interior sidewalls of the ferroelectric data storage structure 110. In some embodiments, the upper electrode 112 may completely fill the second recess. In some embodiments, the upper electrode 112 may comprise angled interior sidewalls that define a third recess within an upper surface of the upper electrode 112.

Because the lower electrode 108, the ferroelectric data storage structure 110, and the upper electrode 112 are conformal layers, they have a surface area that extends in both a lateral direction and a vertical direction. By extending in both lateral and vertical directions, the layers have a greater effective width (i.e., distance between outer sidewalls of a layer as measured along upper surfaces of the layer). The greater effective width increases a size of the ferroelectric data storage structure 110 without increasing a footprint of the ferroelectric memory device 104. By increasing a size of the ferroelectric data storage structure 110, a performance of the ferroelectric memory device 104 may be improved.

Figure 8:
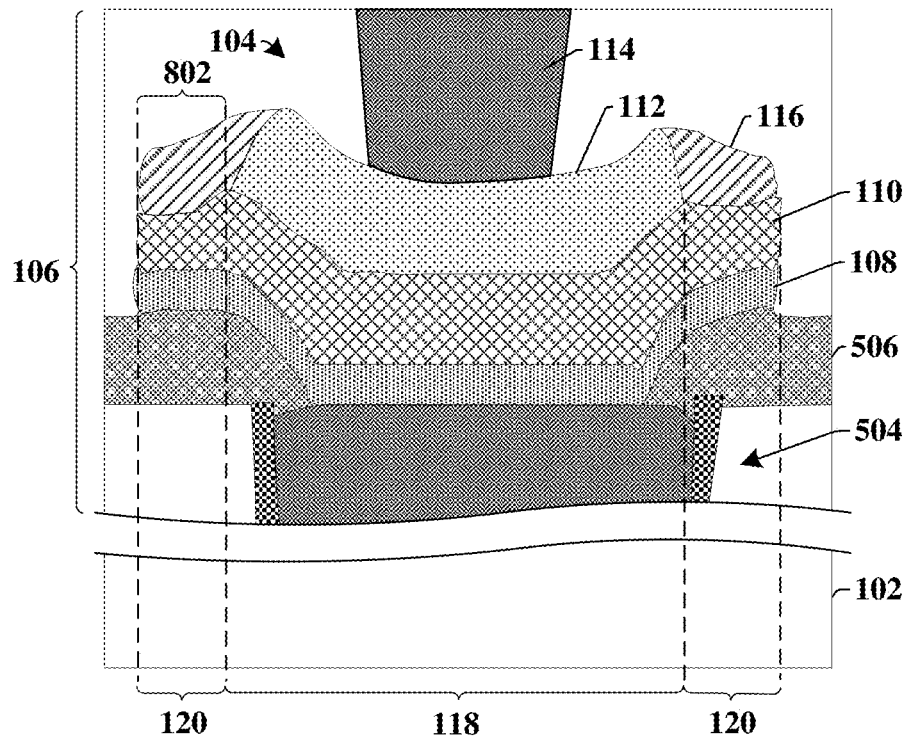
FIG. 8 illustrates a cross-sectional view of some additional embodiments of an IC having a ferroelectric memory device including one or more stressed sidewall spacers.

FIG. 8 illustrates a cross-sectional view of some additional embodiments of an integrated chip 800 having a ferroelectric memory device including one or more stressed sidewall spacers.

The integrated chip 800 comprises a ferroelectric memory device 104 arranged over a lower interconnect 504 within a dielectric structure 106 over a substrate 102. The ferroelectric memory device 104 comprises a ferroelectric data storage structure 110 disposed between a lower electrode 108 and an upper electrode 112. One or more stressed sidewall spacers 116 are disposed along opposing sides of the upper electrode 112.

In some embodiments, the ferroelectric data storage structure 110 may have one or more recesses 802 within an upper surface of the ferroelectric data storage structure 110. The one or more recesses 802 are disposed within one or more peripheral regions 120 of the ferroelectric data storage structure 110 that surround a central region 118 of the ferroelectric data storage structure 110. The one or more recesses 802 reduce a thickness of the ferroelectric data storage structure 110 within the one or more peripheral regions 120, so that the ferroelectric data storage structure 110 has a greater thickness within the central region 118 than within the one or more peripheral regions 120.

The one or more stressed sidewall spacers 116 extend from along sides of the upper electrode 112 to within one or more recesses 802, so that the one or more stressed sidewall spacers 116 extend along one or more sidewalls of the ferroelectric data storage structure 110. Having the one or more sidewall spacers 116 extend along one or more sidewalls of the ferroelectric data storage structure 110 may allow for the one or more sidewall spacers 116 to increase an orthorhombic phase concentration (e.g., a polar orthorhombic phase concentration) within the central region 118 of the ferroelectric data storage structure 110. In such embodiments, the orthorhombic phase concentration of the ferroelectric data storage structure 110 within the one or more peripheral regions 120 and within a part of the central region 118 may be greater than or equal to approximately 70%, thereby further improving operation of the ferroelectric memory device 104.

Figure 9:
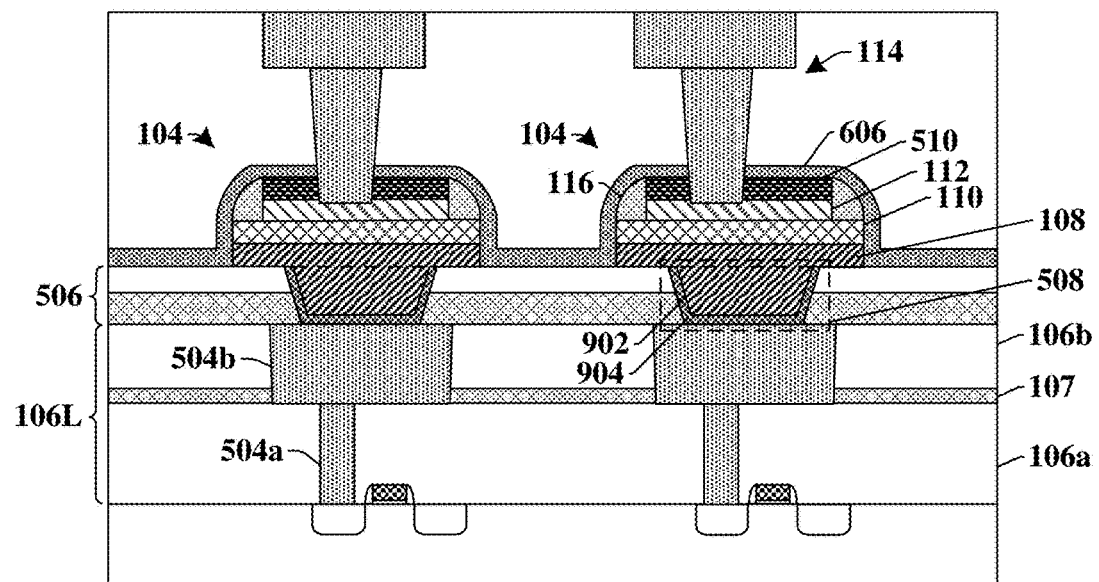
FIG. 9 illustrates a cross-sectional view of some additional embodiments of an IC having a ferroelectric memory device including one or more stressed sidewall spacers.

FIG. 9 illustrates a cross-sectional view of some additional embodiments of an integrated chip 900 having a ferroelectric memory device including one or more stressed sidewall spacers.

The integrated chip 900 comprises one or more lower interconnects 504a-504b disposed within a lower dielectric structure 106L disposed over a substrate 102. In some embodiments, the lower dielectric structure 106L may comprise a first lower ILD layer 106a and a second lower ILD layer 106b separated by an etch stop layer 107. A lower insulating structure 506 is disposed over the lower dielectric structure 106L and the one or more lower interconnects 504a-504b. A lower electrode via 508 extends through the lower insulating structure 506. In some embodiments, the lower electrode via 508 comprises a conductive core 902 surrounded by a liner 904. In some embodiments, the conductive core 902 and the liner 904 have upper surfaces that are substantially co-planar with an upper surface of the lower insulating structure 506.

A ferroelectric memory device 104 is arranged on the lower electrode via 508. The ferroelectric memory device 104 comprises a ferroelectric data storage structure 110 disposed between a lower electrode 108 and an upper electrode 112. In some embodiments, a hard mask 510 is over the upper electrode 112. One or more stressed sidewall spacers 116 are disposed along opposing sides of the upper electrode 112 and the hard mask 510.

A protective structure 606 is disposed over the one or more stressed sidewall spacers 116 and the hard mask 510. The protective structure 606 continuously extends from over the hard mask 510 to the lower insulating structure 506. In some embodiments, the hard mask 510 and the protective structure 606 may respectively have a thickness in a range of between approximately 50 Å and approximately 150 Å. An upper ILD layer 106U is arranged over the protective structure 606. An upper interconnect structure 114 is disposed within the upper ILD layer 106U. The upper interconnect structure 114 extends from an upper surface of the upper ILD layer 106U to the upper electrode 112.

Figure 10:
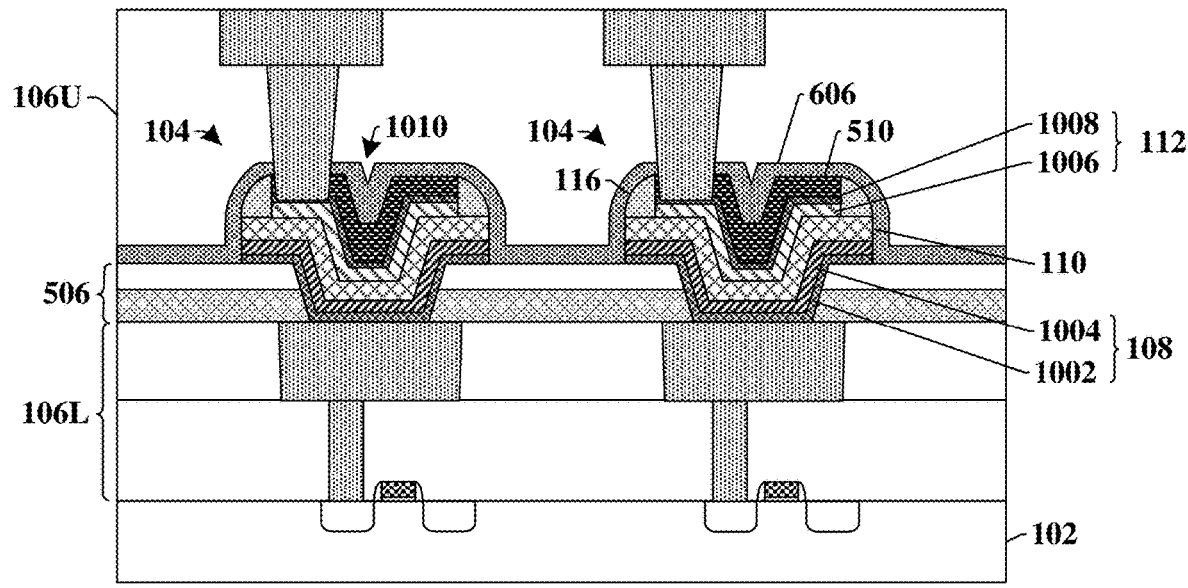
FIG. 10 illustrates a cross-sectional view of some additional embodiments of an IC having a ferroelectric memory device including one or more stressed sidewall spacers.

FIG. 10 illustrates a cross-sectional view of some additional embodiments of an integrated chip 1000 having a ferroelectric memory device including one or more stressed sidewall spacers.

The integrated chip 1000 comprises a ferroelectric memory device 104 disposed over a lower insulating structure 506 that is over a lower dielectric structure 106L on a substrate 102. The ferroelectric memory device 104 comprises a ferroelectric data storage structure 110 disposed between a lower electrode 108 and an upper electrode 112. In some embodiments, the lower electrode 108 may comprise a first lower electrode material 1002 and a second lower electrode material 1004. In some embodiments, the upper electrode 112 may comprise a first upper electrode material 1006 and a second upper electrode material 1008. One or more stressed sidewall spacers 116 are disposed along opposing sides of the upper electrode 112 and a hard mask 510.

In some embodiments, the lower electrode 108, the ferroelectric data storage structure 110, and the upper electrode 112 are conformal layers (e.g., that respectively have a substantially V shaped structure). In such embodiments, a protective structure 606 may extend from over the one or more stressed sidewall spacers 116 to within a recess within an upper surface of the hard mask 510. An upper ILD layer 106U, which surrounds the ferroelectric memory device 104 may extend to within a recess 1010 defined by sidewalls of the protective structure 606.

FIGS. 11-22 illustrates some embodiments of a method of forming an integrated chip having a ferroelectric memory device including one or more stressed sidewall spacers configured to affect an orthorhombic phase concentration within a ferroelectric data storage structure. Although FIGS. 11-22 are described in relation to a method, it will be appreciated that the structures disclosed in FIGS. 11-22 are not limited to such a method, but instead may stand alone as structures independent of the method.

Figure 11:
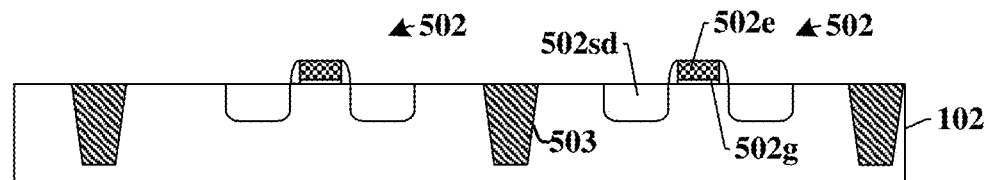

As shown in cross-sectional view 1100 of FIG. 11, a substrate 102 is provided. In various embodiments, the substrate 102 may be any type of semiconductor body (e.g., silicon, SiGe, SOI, etc.), such as a semiconductor wafer and/or one or more die on a wafer, as well as any other type of semiconductor and/or epitaxial layers, associated therewith. An access device 502 may be formed within the substrate 102. In some embodiments, the access device 502 may comprise a transistor. In some such embodiments, the access device 502 may be formed by depositing a gate dielectric film and a gate electrode film over the substrate 102. The gate dielectric film and the gate electrode film are subsequently patterned to form a gate dielectric (e.g., 502g) and a gate electrode (e.g., 502e). The substrate 102 may be subsequently implanted to form a source/drain regions (e.g., 502sd) within the substrate 102 and on opposing sides of the gate electrode (e.g., 502e). In some embodiments, one or more isolation structures 503 (e.g., STI structures) may be formed within the substrate 102 between an access device 502 and a neighboring access device.

Figure 12:
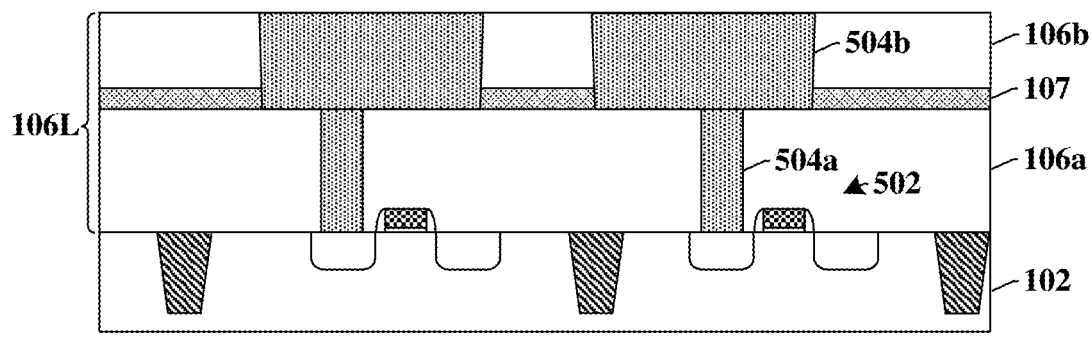

As shown in cross-sectional view 1200 of FIG. 12, a plurality of lower interconnects 504a-504b are formed within a lower dielectric structure 106L comprising one or more lower inter-level dielectric (ILD) layers 106a-106b formed over the substrate 102. In some embodiments, the one or more lower ILD layers 106a-106b may comprise a first lower ILD layer 106a and a second lower ILD layer 106b separated by an etch stop layer 107. In some embodiments, the plurality of lower interconnects 504a-504b may comprise a conductive contact, an interconnect wire, and/or an interconnect via. The plurality of lower interconnects 504a-504b may be formed by forming one of the one or more lower ILD layers 106a-106b (e.g., an oxide, a low-k dielectric, or an ultra low-k dielectric) over the substrate 102, selectively etching the lower ILD layer to define a hole and/or a trench within the lower ILD layer, forming a conductive material (e.g., copper, aluminum, tungsten, etc.) within the hole and/or a trench, and performing a planarization process (e.g., a chemical mechanical planarization (CMP) process) to remove excess of the conductive material from over the lower ILD layer.

Figure 13:
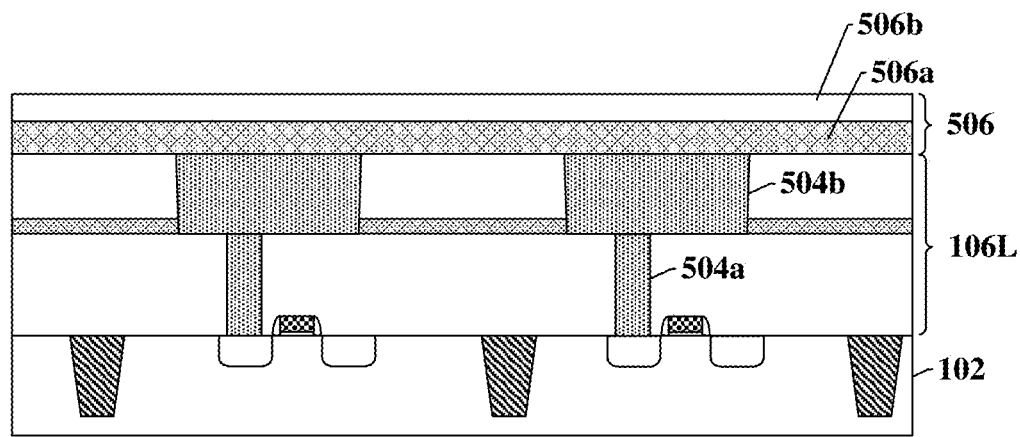

As shown in cross-sectional view 1300 of FIG. 13, a lower insulating structure 506 is formed over the lower dielectric structure 106L. In some embodiments, the lower insulating structure 506 may comprise one or more of an oxide, silicon nitride, silicon carbide, silicon oxynitride, TEOS, a metal oxide, a metal nitride, a metal carbide, or the like. In some embodiments, the lower insulating structure 506 may be formed to have a first lower insulating layer 506a and a second lower insulating layer 506b over the first lower insulating layer 506a. In some embodiments, the lower insulating structure 506 may be formed by one or more different deposition processes (e.g., physical vapor deposition (PVD), chemical vapor deposition (CVD), PE-CVD, atomic layer deposition (ALD), sputtering, etc.) to a thickness in a range of between approximately 200 angstroms and approximately 400 angstroms.

Figure 14:
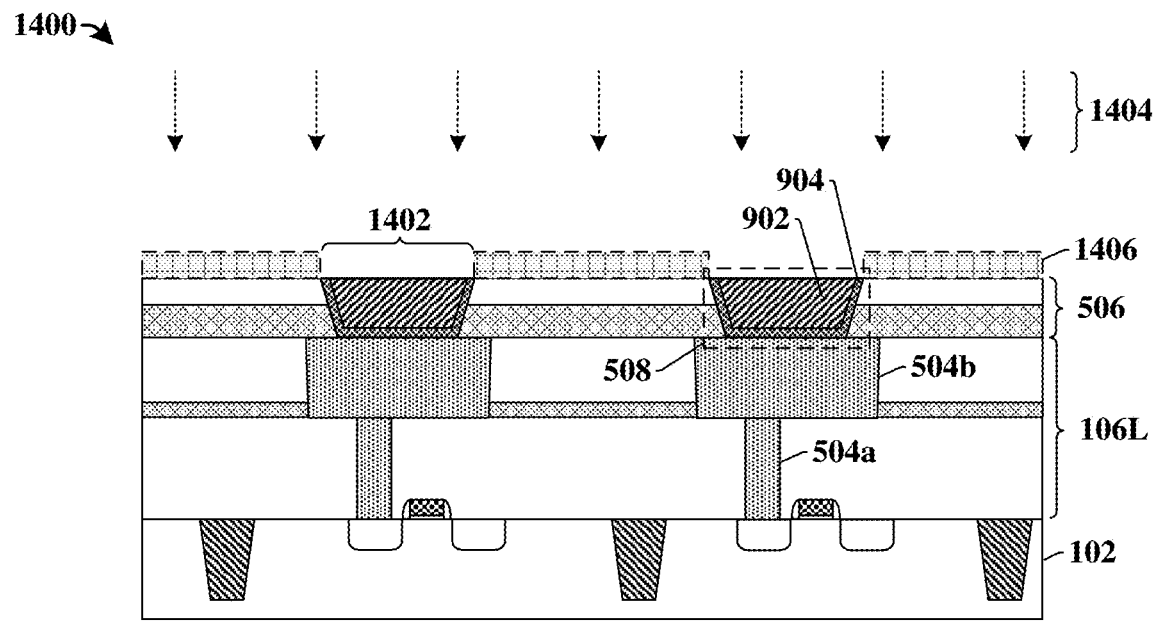

As shown in cross-sectional view 1400 of FIG. 14, the lower insulating structure 506 is selectively patterned to define a plurality of openings 1402 extending through the lower insulating structure 506. The plurality of openings 1402 expose the plurality of lower interconnects 504a-504b. In some embodiments, the lower insulating structure 506 may be selectively patterned by exposing the lower insulating structure 506 to an etchant 1404 according to a mask 1406 disposed on the lower insulating structure 506. In some embodiments, the mask 1406 may comprise a photoresist material, a hard mask, or the like. In some embodiments, the etchant 1404 may comprise a dry etchant (e.g., comprising fluorine or chlorine).

A lower electrode via 508 is formed within the plurality of openings 1402. The lower electrode via 508 extends through the lower insulating structure 506 to the plurality of lower interconnects 504a-504b. In some embodiments, the lower electrode via 508 may be formed by depositing a liner 904 followed by depositing a conductive core 902. In some such embodiments, the liner 904 may be formed over the lower insulating structure 506 and within the plurality of openings 1402 prior to forming the conductive core 902 over the liner 904 and within the plurality of openings 1402. In some embodiments, a planarization process (e.g., a CMP process) may be performed after depositing a conductive material onto the liner 904 to form the conductive core 902. In various embodiments, the liner 904 may comprise a glue layer configured to increase adhesion between adjacent layers and/or a diffusion barrier layer configured to prevent diffusion between adjacent layers. In some embodiments, the liner 904 may comprise one or more of titanium nitride, platinum, aluminum copper, gold, titanium, tantalum, tungsten, tungsten nitride, or the like. In some embodiments, the conductive core 902 may comprise one or more of tantalum, tantalum nitride, titanium, titanium nitride, tungsten, platinum, or the like.

Figure 15:
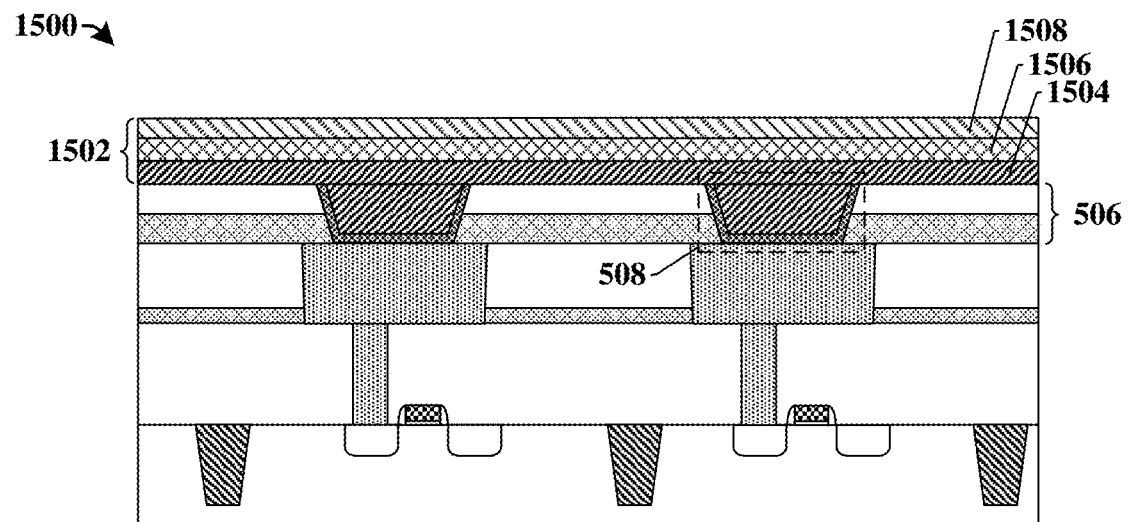

As shown in cross-sectional view 1500 of FIG. 15, a FeRAM stack 1502 is formed over the lower electrode via 508 and the lower insulating structure 506. The FeRAM stack 1502 may comprise a lower electrode layer 1504 formed over the lower electrode via 508 and the lower insulating structure 506, a ferroelectric data storage layer 1506 formed over the lower electrode layer 1504, and an upper electrode layer 1508 formed over the ferroelectric data storage layer 1506. In some embodiments, the lower electrode layer 1504 and the upper electrode layer 1508 may comprise a metal (e.g., titanium, tantalum, etc.), a metal nitride (e.g., titanium nitride, tantalum nitride, etc.), or the like. In some embodiments, the ferroelectric data storage layer 1506 may comprise a binary oxide, a ternary oxide, a quaternary oxide, hafnium oxide doped with silicon, zirconium, gadolinium, or the like. In some embodiments, a nitrogen plasma process may be performed after forming the lower electrode layer 1504 and before forming the ferroelectric data storage layer 1506. The nitrogen plasma process may expose the lower electrode layer 1504 to a nitrous oxide ($N_2O$) based plasma to reduce a roughness of an uppermost surface of the lower electrode layer 1504.

Figure 16:
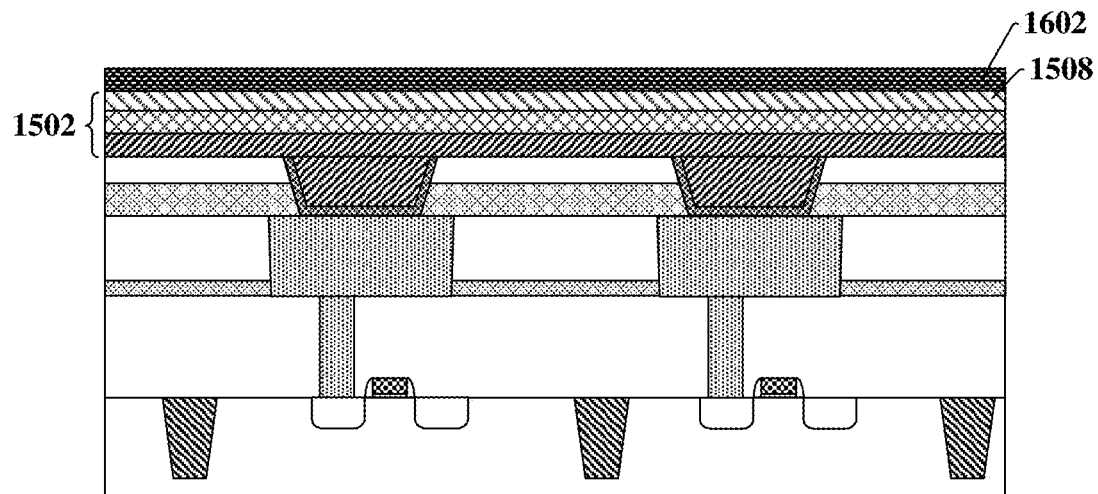

As shown in cross-sectional view 1600 of FIG. 16, a hard mask layer 1602 is formed over the upper electrode layer 1508. In some embodiments, the hard mask layer 1602 may comprise one or more of titanium nitride, silicon oxide, silicon nitride, silicon carbon nitride, a metal oxide (e.g., titanium oxide, aluminum oxide, etc.), or the like.

Figure 17:
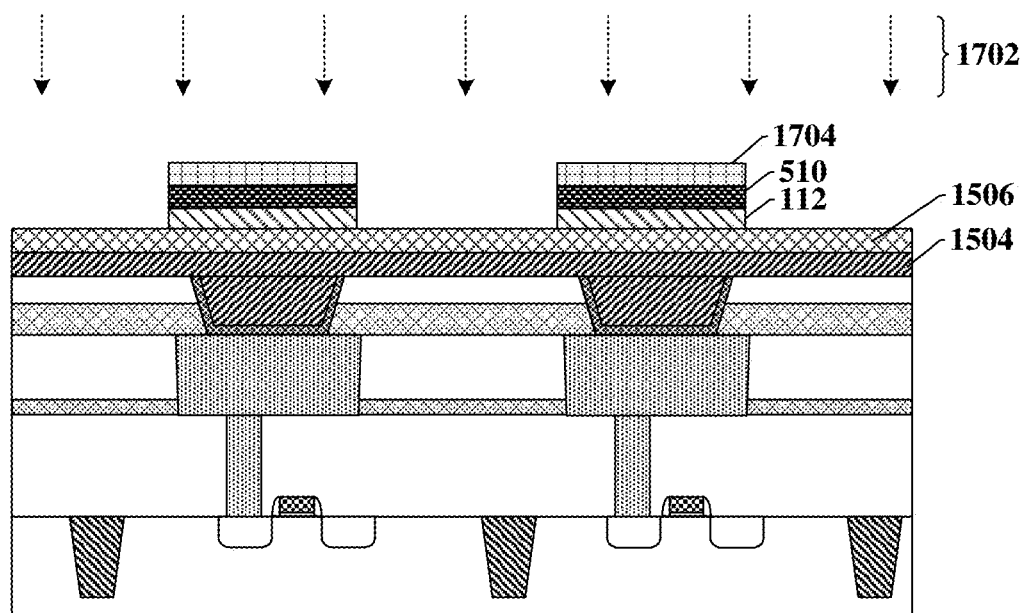

As shown in cross-sectional view 1700 of FIG. 17, a first patterning process is performed to define an upper electrode 112 and a hard mask 510. The first patterning process selectively exposes the hard mask layer (1602 of FIG. 16) and the upper electrode layer (1508 of FIG. 16) to an etchant 1702 according to a mask 1704 (e.g., a photoresist material, a hard mask, or the like) to define the upper electrode 112 and the hard mask 510.

As shown in cross-sectional view 1800 of FIG. 18A, one or more stressed sidewall spacers 116 are formed along sidewalls of the upper electrode 112 and the hard mask 510. In some embodiments, the one or more stressed sidewall spacers 116 may completely cover sidewalls of the upper electrode 112 and/or the hard mask 510. In various embodiments, the one or more stressed sidewall spacers 116 may comprise silicon nitride, silicon carbon nitride, aluminum nitride, or the like. In some embodiments, the one or more stressed sidewall spacers 116 may be formed to have a stress that comprises a tensile stress (e.g., a stress that generates a force pointing laterally away from the upper electrode 112). In other embodiments, the one or more stressed sidewall spacers 116 may be formed to have a stress that comprises a compressive stress (e.g., a stress that generates a force pointing laterally towards the upper electrode 112). In some embodiments, the stress may be in a range of between approximately 50 MPa and approximately 1200 MPa, between approximately 100 MPa and approximately 1000 MPa, between approximately 200 MPa and approximately 600 MPa, between approximately 400 MPa and approximately 500 MPa, or other similar values.

In some embodiments, the one or more stressed sidewall spacers 116 may be formed by forming a stressed spacer layer over the substrate. In some embodiments, the stressed spacer layer may be formed using a deposition technique (e.g., PVD, CVD, PE-CVD, ALD, sputtering, etc.). The stressed spacer layer is subsequently exposed to an etchant (e.g., a dry etchant), which removes the stressed spacer layer from horizontal surfaces. Removing the stressed spacer layer from horizontal surfaces leaves a part of the stressed spacer layer along opposing sides of the upper electrode 112 and the hard mask 510 as the one or more stressed sidewall spacers 116.

In some embodiments, the one or more stressed sidewall spacers 116 may comprise a silicon nitride material (e.g., a silicon rich nitride) having a nitrogen to silicon ratio that is approximately 1.35, greater than approximately 1.35, greater than approximately 1.5, or other similar values. In some embodiment, the silicon nitride material may have a refractive index of less than approximately 1.9 as measured at 633 nm. In some embodiments, the silicon nitride material may be formed using a vapor deposition technique (e.g., a chemical vapor deposition technique) that uses silane ($SiH_4$) and ammonia ($NH_3$) as reacting gases. In some embodiments, the $SiH_4$ gas may be introduced into a process chamber at a flow rate of between approximately 10 sccm (standard cubic centimeters per minute) and approximately 100 sccm. In some embodiments, a ratio of $NH_3$ gas to $SiH_4$ gas may be between approximately 0.8 and approximately 3. In some embodiments, the vapor deposition technique may be performed at a power that is in a range of between approximately 10 W and approximately 250 W, at a pressure of between approximately 3 torr and approximately 6 torr, and at a temperature of between approximately 200° C. and approximately 400° C.

It will be appreciated that the one or more stressed sidewall spacers 116 can be formed to have various stresses by changing process parameters such as a flow rate of $SiH_4$, a flow rate of $NH_3$, a power of the deposition process, a temperature of the deposition process, a pressure of the deposition process, and/or the like. For example, FIG. 18B illustrates a graph 1802 having a first trend line 1804 that shows a $SiH_4$ flow rate (x-axis) as a function of stress value (y-axis). As the $SiH_3$ flow rate decreases, the stress value of the one or more stressed sidewall spacers 116 increases. FIG. 18C illustrates a graph 1806 having a second trend line 1808 that shows a $NH_3$ flow rate (x-axis) as a function of stress value (y-axis). As the $NH_3$ flow rate increases, the stress value of the one or more stressed sidewall spacers 116 increases. FIG. 18D illustrates a graph 1810 having a third trend line 1812 that shows a power of a deposition process (x-axis) as a function of stress value (y-axis). As the power decreases, the stress value of the one or more stressed sidewall spacers 116 increases.

In other embodiments, the one or more stressed sidewall spacers 116 may comprise silicon carbon nitride (SiCN) material (e.g., nitrogen rich SiCN) having a refractive index of less than approximately 1.98 as measured at 633 nm. In yet other embodiments, the one or more stressed sidewall spacers 116 may comprise aluminum nitride having a stress value of between approximately 0 MPa and approximately 600 MPa. In some embodiments, the aluminum nitride may have a ratio of N to Al that is between approximately 1.01 and approximately 1.05. In some embodiments, the aluminum nitride may have a refractive index that is between approximately 2.0 and approximately 2.08.

Figure 19:
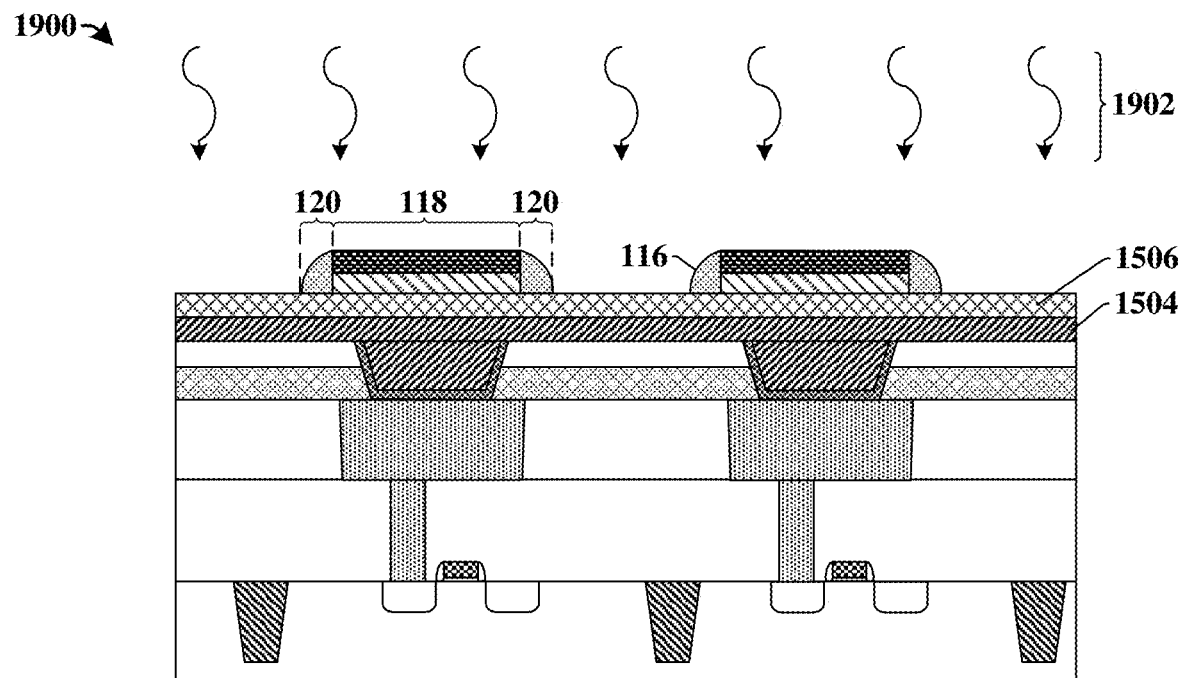

As shown in cross-sectional view 1900 of FIG. 19, an anneal process 1902 is performed after forming the one or more stressed sidewall spacers 116. Due to the stress of the one or more stressed sidewall spacers 116, the anneal process 1902 increases an orthorhombic crystal phase (e.g., a polar orthorhombic crystal phase) within parts of the ferroelectric data storage layer 1506 that are directly below the one or more stressed sidewall spacers 116. In some embodiments, the anneal process may change parts of the ferroelectric data storage layer 1506 from an amorphous phase, a monoclinic phase, and/or a tetragonal phase to an orthorhombic phase (e.g., a polar orthorhombic phase). In some additional embodiments, the anneal process may change parts of the ferroelectric data storage layer 1506 from a non-polar orthorhombic phase to a polar orthorhombic phase. Changing the non-polar orthorhombic phase to a polar orthorhombic phase can help improve a performance of a resulting ferroelectric memory device, since the polar orthorhombic phase provides for better ferroelectric properties than the non-polar orthorhombic phase.

In some embodiments, the anneal process 1902 may be performed at a temperature of greater than approximately 300° C., greater than approximately 400° C., greater than approximately 500° C., or other similar values. In some embodiments, the anneal process 1902 may be performed for approximately 30 minutes, for approximately 40 minutes, or other similar values. In some embodiments, the anneal process 1902 may be performed at a temperature of greater than approximately 400° C. for approximately 30 minutes.

In some embodiments, the ferroelectric data storage layer 1506 may have a central region 118 arranged directly below the upper electrode 112 and one or more peripheral regions 120 directly below the one or more stressed sidewall spacers 116. The one or more peripheral regions 120 laterally surround the central region 118. Because the one or more stressed sidewall spacers 116 are arranged directly over the one or more peripheral regions 120, the anneal process 1902 may increase the orthorhombic phase concentration (e.g., the polar orthorhombic phase concentration) within the central region 118 of the ferroelectric data storage layer 1506 by a first amount and further increase the orthorhombic phase concentration (e.g., the polar orthorhombic phase concentration) within the one or more peripheral regions 120 by a second amount that is larger than the first amount. In some embodiments, the orthorhombic phase concentration (e.g., the polar orthorhombic phase concentration) of the central region 118 of the ferroelectric data storage layer 1506 is greater than the orthorhombic phase concentration (e.g., the polar orthorhombic phase concentration) of the one or more peripheral regions 120 prior to performing the anneal process 1902. After performing the anneal process 1902 the orthorhombic phase concentration (e.g., the polar orthorhombic phase concentration) of the central region 118 is smaller than the orthorhombic phase concentration (e.g., the polar orthorhombic phase concentration) of the one or more peripheral regions 120.

In some embodiments, after the anneal process 1902 is completed the central region 118 of the ferroelectric data storage layer 1506 may have an orthorhombic phase concentration of greater than approximately 40% and the one or more peripheral regions 120 may have an orthorhombic phase concentration of greater than approximately 75%. In some embodiments, a region of the ferroelectric data storage layer 1506 that is between outer sidewalls of the one or more stressed sidewall spacers 116 (e.g., outer sidewalls facing away from the upper electrode 112) may have an orthorhombic phase concentration of less than 40%. In some embodiments, the anneal process 1902 may increase the orthorhombic phase concentration of the ferroelectric data storage layer 1506 within the one or more peripheral regions 120 by between approximately 100% and approximately 1000%, by between approximately 200% and approximately 500%, or other similar values. For example, the anneal process 1902 may increase the orthorhombic phase concentration of the ferroelectric data storage layer 1506 within the one or more peripheral regions 120 from 10.1% to approximately 77%. In some embodiments, the anneal process 1902 gives the ferroelectric data storage layer 1506 a predominately orthorhombic phase (e.g., a predominately polar orthorhombic phase).

In some embodiments, after the anneal process 1902 is performed the ferroelectric data storage layer 1506 may comprise a higher concentration of a polar orthorhombic phase than a non-polar orthorhombic phase. In some embodiments, the anneal process 1902 increases a polar orthorhombic phase concentration within the one or more peripheral regions 120 by a first amount that is larger than a second amount by which a non-polar orthorhombic phase concentration is increased within the one or more peripheral regions 120.

In some embodiments, the anneal process 1902 may reduce a variation in the orthorhombic phase concentration between the central region 118 and the one or more peripheral regions 120, so as to give the ferroelectric data storage layer 1506 a more uniform orthorhombic phase. For example, prior to the anneal process 1902 the central region 118 may have an orthorhombic phase concentration that is approximately 2 times larger than that of the one or more peripheral regions 120. After the anneal process 1902, the one or more peripheral regions 120 may have an orthorhombic phase concentration that in a range of between 1.5 and 1.9 times larger than that of the central region 118.

Figure 20:
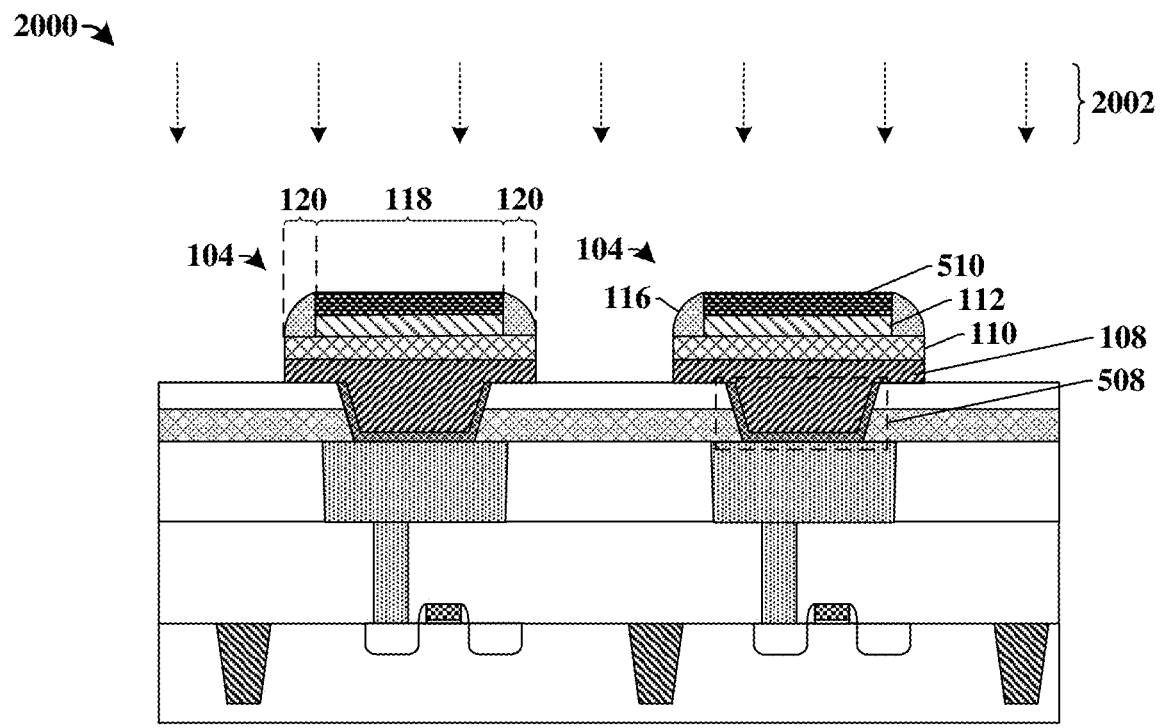

As shown in cross-sectional view 2000 of FIG. 20, a second patterning process is performed to form a ferroelectric memory device 104 (e.g., a FeRAM device) comprising a ferroelectric data storage structure 110 disposed between a lower electrode 108 and the upper electrode 112. The second patterning process selectively exposes the ferroelectric data storage layer (1506 of FIG. 19) and the lower electrode layer (1504 of FIG. 19) to an etchant 2002 to define the ferroelectric data storage structure 110 and the lower electrode 108. In some embodiments, the second patterning process may further etch the lower insulating structure 506, so as to cause the lower insulating structure 506 to have a smaller thickness laterally outside of the lower electrode 108 than directly below the lower electrode 108.

Figure 21:
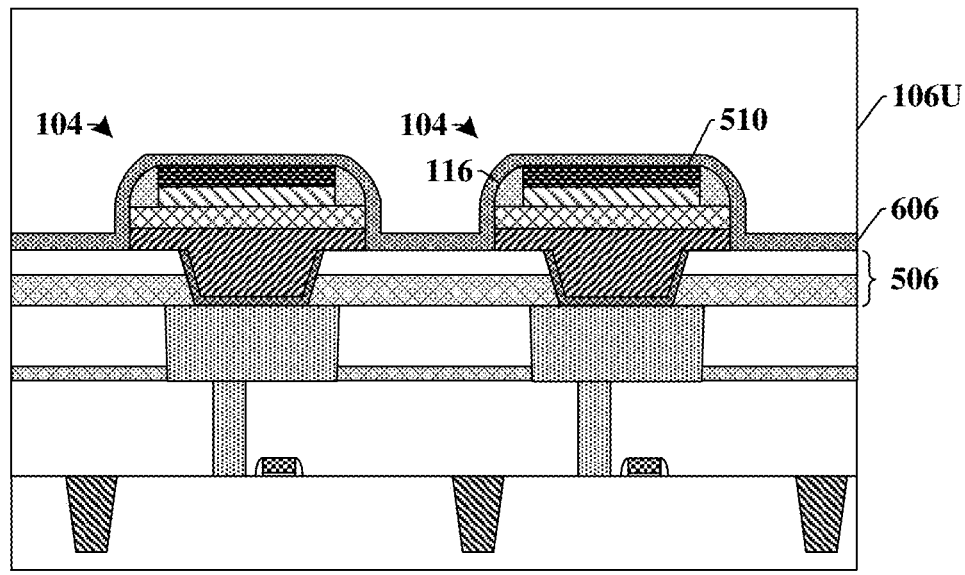

As shown in cross-sectional view 2100 of FIG. 21, a protective structure 606 is formed over the ferroelectric memory device 104. In some embodiments, the protective structure 606 may be formed using one or more deposition techniques (e.g., PVD, CVD, PE-CVD, ALD, sputtering, etc.). In various embodiments, the protective structure 606 may comprise one or more of silicon carbide, TEOS, and/or the like.

An upper ILD layer 106U is formed over the protective structure 606. The upper ILD layer 106U is formed to cover the ferroelectric memory device 104. In some embodiments, the upper ILD layer 106U may be formed by a deposition process (e.g., PVD, CVD, PE-CVD, ALD, or the like). In various embodiments, the upper ILD layer 106U may comprise silicon dioxide, carbon doped silicon dioxide, silicon oxynitride, BSG, PSG, BPSG, FSG, a porous dielectric material (e.g., porous carbon doped silicon dioxide), or the like.

Figure 22:
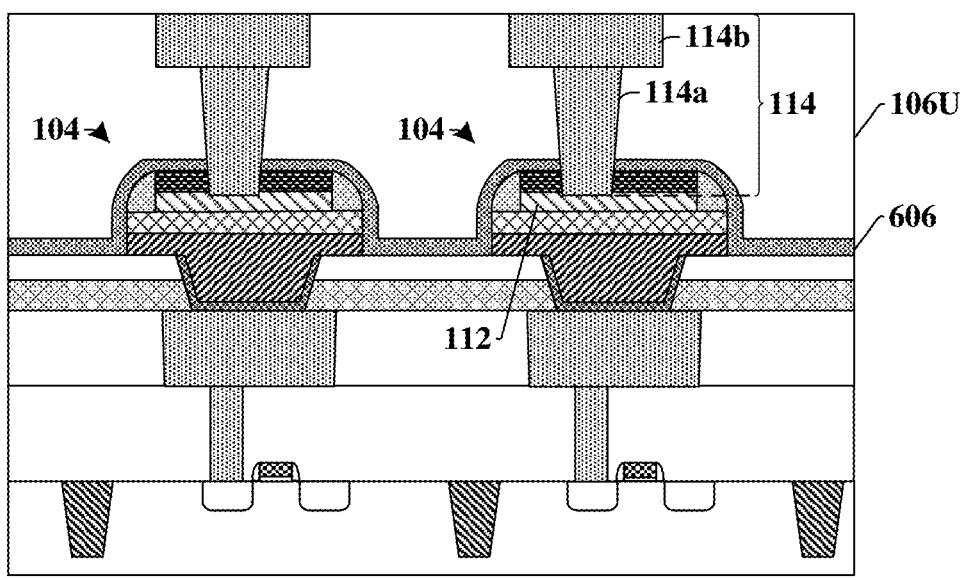

As shown in cross-sectional view 2200 of FIG. 22, an upper interconnect structure 114 is formed within the upper ILD layer 106U. In some embodiments, the upper interconnect structure 114 may comprise an interconnect via 114a (e.g., a top electrode via (TEVA)) and/or an interconnect wire 114b. In some embodiments, the upper interconnect structure 114 may be formed by selectively etching the upper ILD layer 106U to define holes and/or trenches within the upper ILD layer 106U, forming a conductive material (e.g., copper, aluminum, etc.) within the holes and/or trenches, and performing a planarization process (e.g., a chemical mechanical planarization process).

FIGS. 23-33 illustrate cross-sectional views 2300-3300 of some additional embodiments of a method of forming an integrated chip having a ferroelectric memory device including one or more stressed sidewall spacers. Although FIGS. 23-33 are described in relation to a method, it will be appreciated that the structures disclosed in FIGS. 23-33 are not limited to such a method, but instead may stand alone as structures independent of the method.

Figure 23:
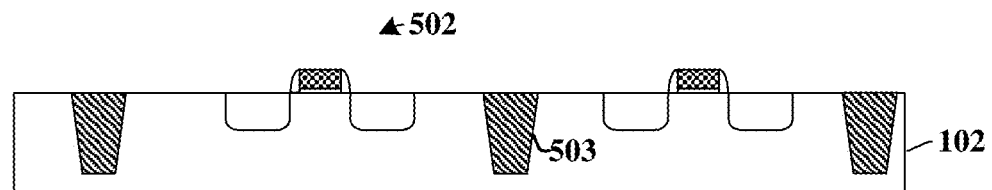
FIGS. 23-33 illustrate cross-sectional views of some additional embodiments of a method of forming an IC having a ferroelectric memory device including one or more stressed sidewall spacers.

As shown in cross-sectional view 2300 of FIG. 23, a substrate 102 is provided. In various embodiments, the substrate 102 may be any type of semiconductor body (e.g., silicon, SiGe, SOI, etc.), such as a semiconductor wafer and/or one or more die on a wafer, as well as any other type of semiconductor and/or epitaxial layers, associated therewith. In some embodiments, an access device 502 may be formed within the substrate 102, as described in relation to FIG. 11.

Figure 24:
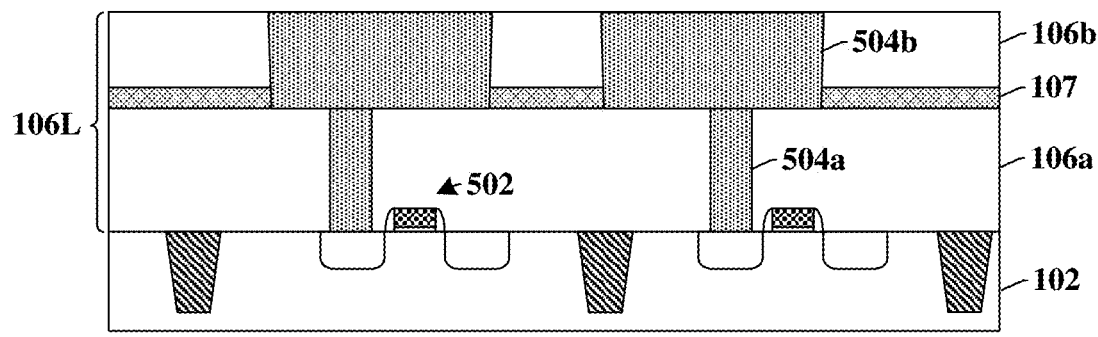

As shown in cross-sectional view 2400 of FIG. 24, a plurality of lower interconnects 504a-504b are formed within a lower dielectric structure 106L comprising one or more lower inter-level dielectric (ILD) layers 106a-106b formed over the substrate 102. In some embodiments, the one or more lower ILD layers 106a-106b may comprise a first lower ILD layer 106a and a second lower ILD layer 106b separated by an etch stop layer 107. In some embodiments, the plurality of lower interconnects 504a-504b may comprise a conductive contact, an interconnect wire, and/or an interconnect via.

Figure 25:
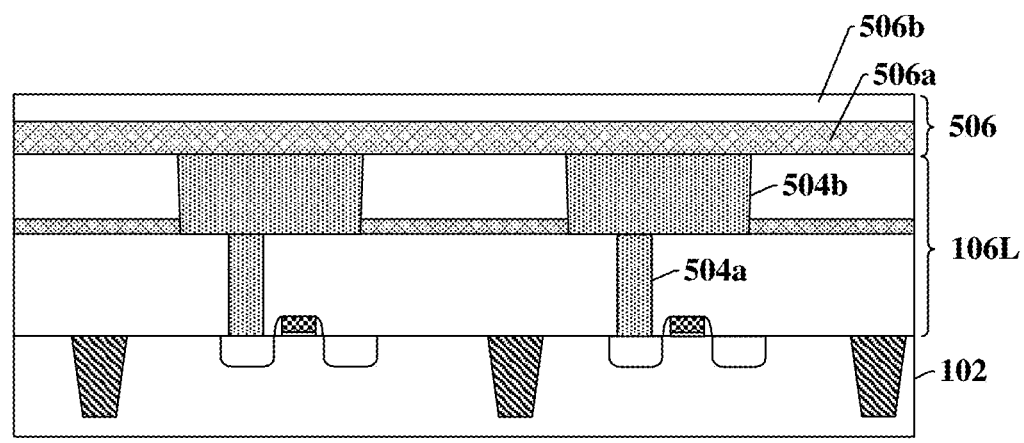

As shown in cross-sectional view 2500 of FIG. 25, a lower insulating structure 506 is formed over the lower dielectric structure 106L. In some embodiments, the lower insulating structure 506 may comprise one or more of an oxide, silicon nitride, silicon carbide, silicon oxynitride, TEOS, a metal oxide, a metal nitride, a metal carbide, or the like.

Figure 26:
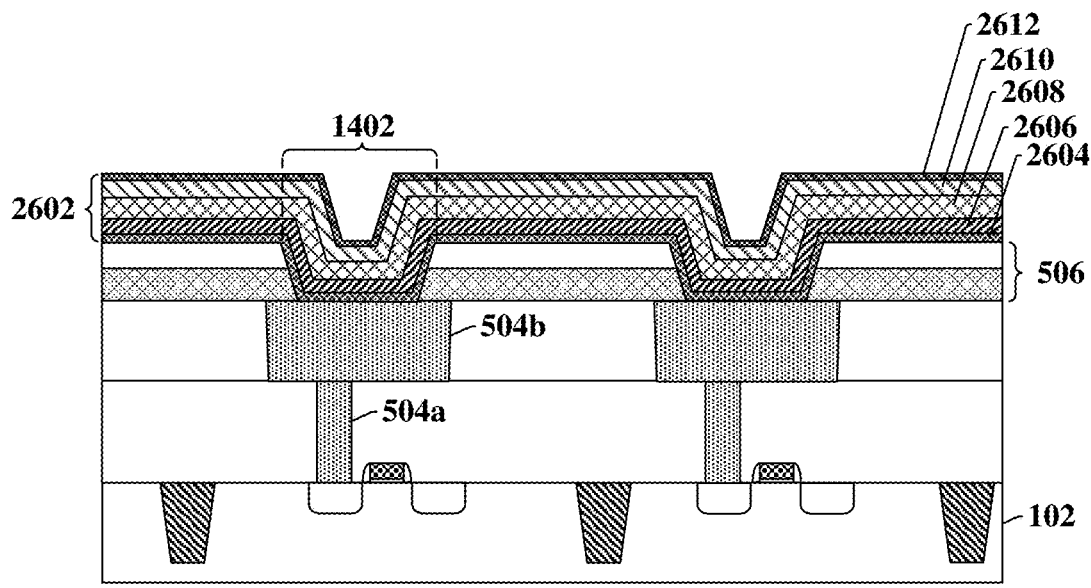

As shown in cross-sectional view 2600 of FIG. 26, the lower insulating structure 506 is selectively patterned to define a plurality of openings 1402 extending through the lower insulating structure 506 to expose the plurality of lower interconnects 504a-504b. In some embodiments (not shown), the lower insulating structure 506 may be selectively patterned by exposing the lower insulating structure 506 to an etchant according to a mask disposed on the lower insulating structure 506.

A FeRAM stack 2602 is formed over the lower insulating structure 506 and within the plurality of openings 1402. In some embodiments, the FeRAM stack 2602 may comprise a plurality of conformally deposited layers. The FeRAM stack 2602 may comprise a first lower electrode layer 2604 formed over the lower insulating structure 506, a second lower electrode layer 2606 formed over the first lower electrode layer 2604, a ferroelectric data storage layer 2608 formed over the second lower electrode layer 2606, a first upper electrode layer 2610 formed over the ferroelectric data storage layer 2608, and a second upper electrode layer 2612 formed over the first upper electrode layer 2610.

Figure 27:
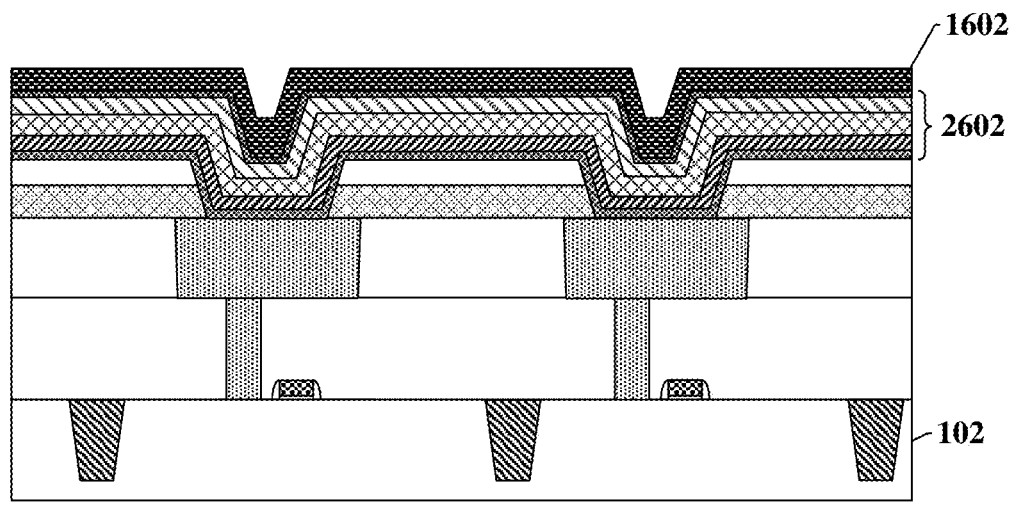

As shown in cross-sectional view 2700 of FIG. 27, a hard mask layer 1602 is formed over the FeRAM stack 2602. In some embodiments, the hard mask layer 1602 may be formed as described in relation to FIG. 16.

Figure 28:
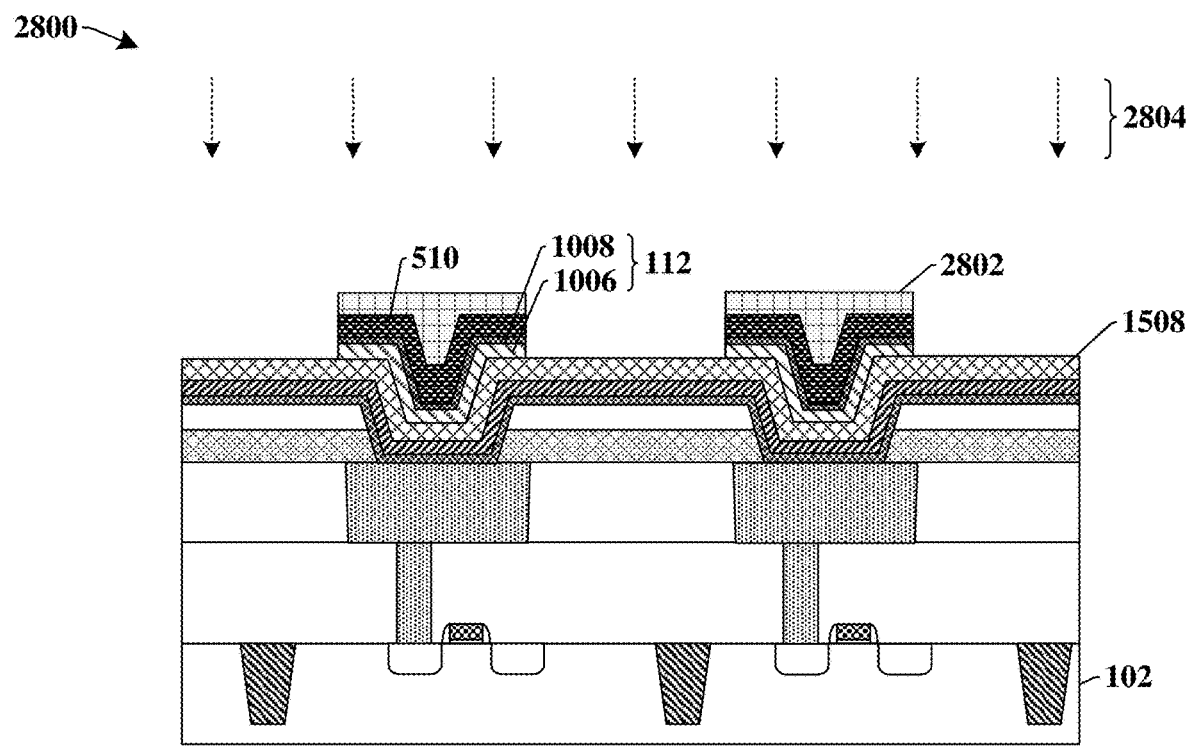

As shown in cross-sectional view 2800 of FIG. 28, a first patterning process is performed to define an upper electrode 112 and a hard mask 510. The first patterning process selectively exposes the hard mask layer (1602 of FIG. 27), the first upper electrode layer (2610 of FIG. 26), and the second upper electrode layer (2612 of FIG. 26) to an etchant 2804 according to a mask 2802 (e.g., a photoresist material, a hard mask, or the like) to form the upper electrode 112 and the hard mask 510. In some embodiments, the upper electrode 112 may comprise a first upper electrode material 1006 and a second upper electrode material 1008. In some embodiments, the hard mask 510 may have a thickness that varies within a central region of the hard mask 510 and that is substantially constant over a peripheral region surrounding the central region. The variations in thickness within the central region cause the hard mask 510 to have different thicknesses at different lateral positions within the central region, as viewed along the cross-sectional view 2800.

Figure 29:
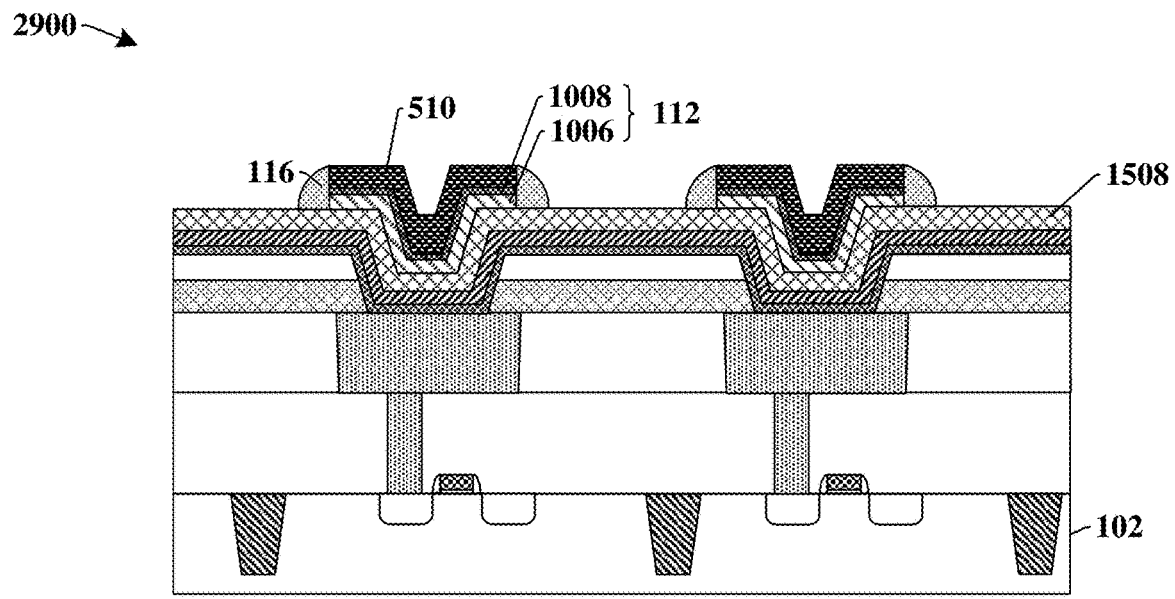

As shown in cross-sectional view 2900 of FIG. 29, one or more stressed sidewall spacers 116 are formed along sidewalls of the upper electrode 112 and the hard mask 510. In some embodiments, the one or more stressed sidewall spacers 116 may comprise one or more materials and/or be formed as described in relation to FIGS. 18A-18D.

Figure 30:
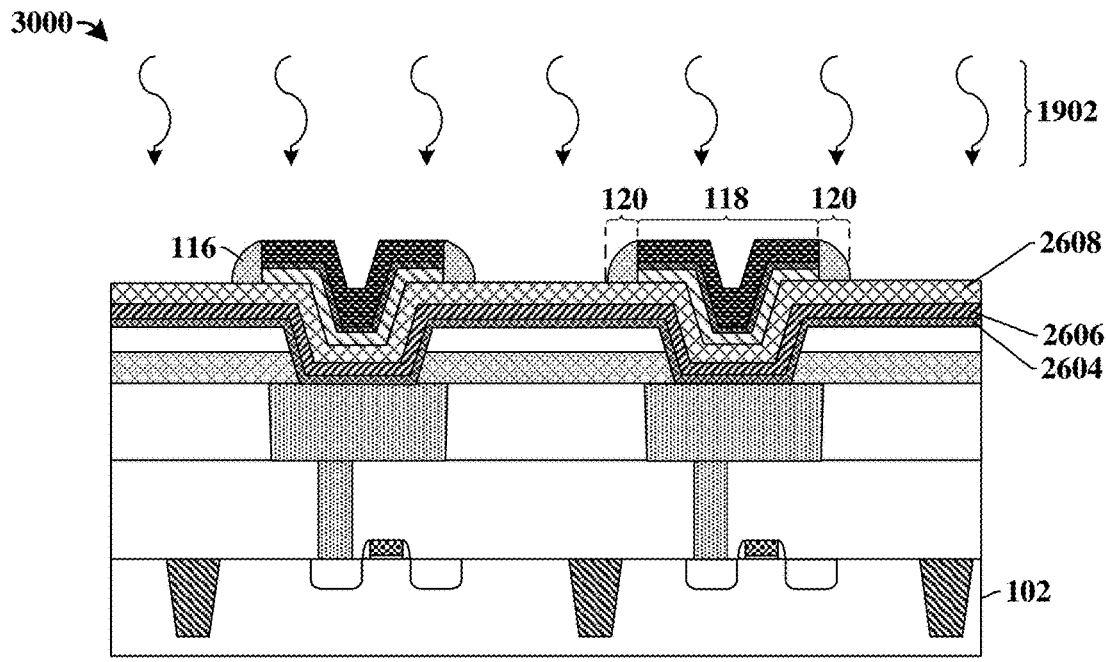

As shown in cross-sectional view 3000 of FIG. 30, an anneal process 1902 is performed after forming the one or more stressed sidewall spacers 116. Due to the stress of the one or more stressed sidewall spacers 116, the anneal process 1902 increases an orthorhombic crystal phase (e.g., a polar orthorhombic crystal phase) within parts of the ferroelectric data storage layer 1506 that are directly below the one or more stressed sidewall spacers 116. In some embodiments, the anneal process 1902 increases an orthorhombic crystal phase within the ferroelectric data storage layer 2608, as described in relation to FIG. 19.

Figure 31:
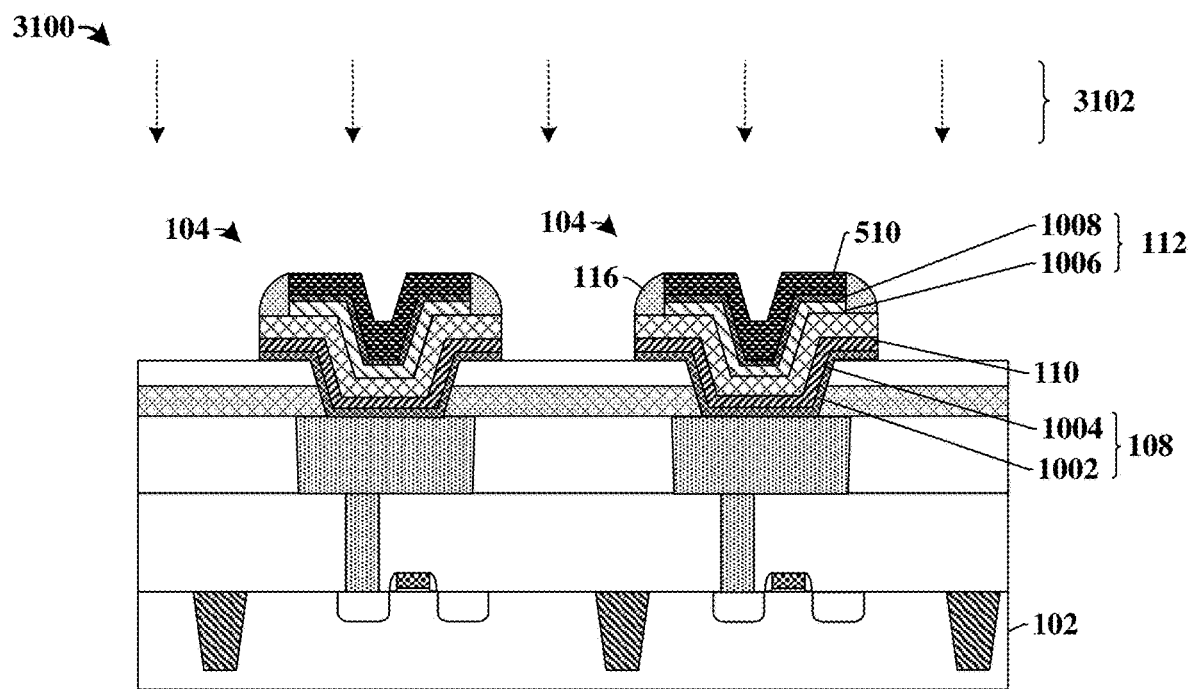

As shown in cross-sectional view 3100 of FIG. 31, a second patterning process is performed to form a ferroelectric memory device 104 comprising a ferroelectric data storage structure 110 disposed between a lower electrode 108 and the upper electrode 112. The second patterning process selectively exposes the ferroelectric data storage layer (2608 of FIG. 30), the first lower electrode layer (2604 of FIG. 30), and the second lower electrode layer (2606 of FIG. 30) to an etchant 3102 to define the ferroelectric data storage structure 110 and the lower electrode 108. In some embodiments, the lower electrode 108 may comprise a first lower electrode material 1002 and a second lower electrode material 1004. In some embodiments, the second patterning process may further etch the lower insulating structure 506, so as to cause the lower insulating structure 506 to have a smaller thickness laterally outside of the lower electrode 108 than directly below the lower electrode 108.

Figure 32:
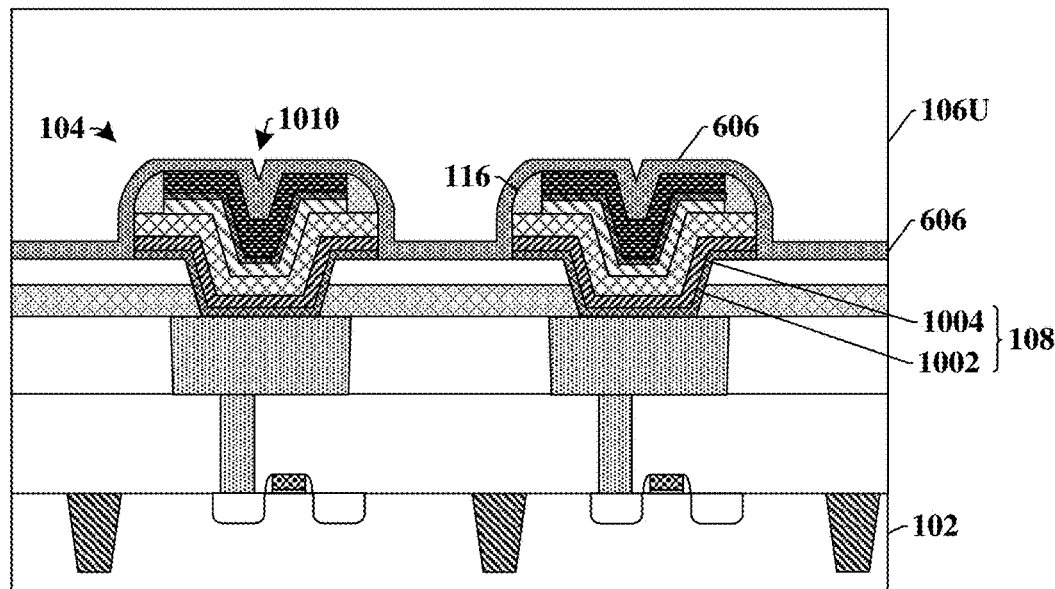

As shown in cross-sectional view 3200 of FIG. 32, a protective structure 606 is formed over the ferroelectric memory device 104. The protective structure 606 has sidewalls and a horizontally extending surface that define a recess 1010 within an upper surface of the protective structure 606 and that is directly over a bottom surface of the lower electrode 108. An upper ILD layer 106U is formed over the protective structure 606. The upper ILD layer 106U is formed to cover the ferroelectric memory device 104.

Figure 33:
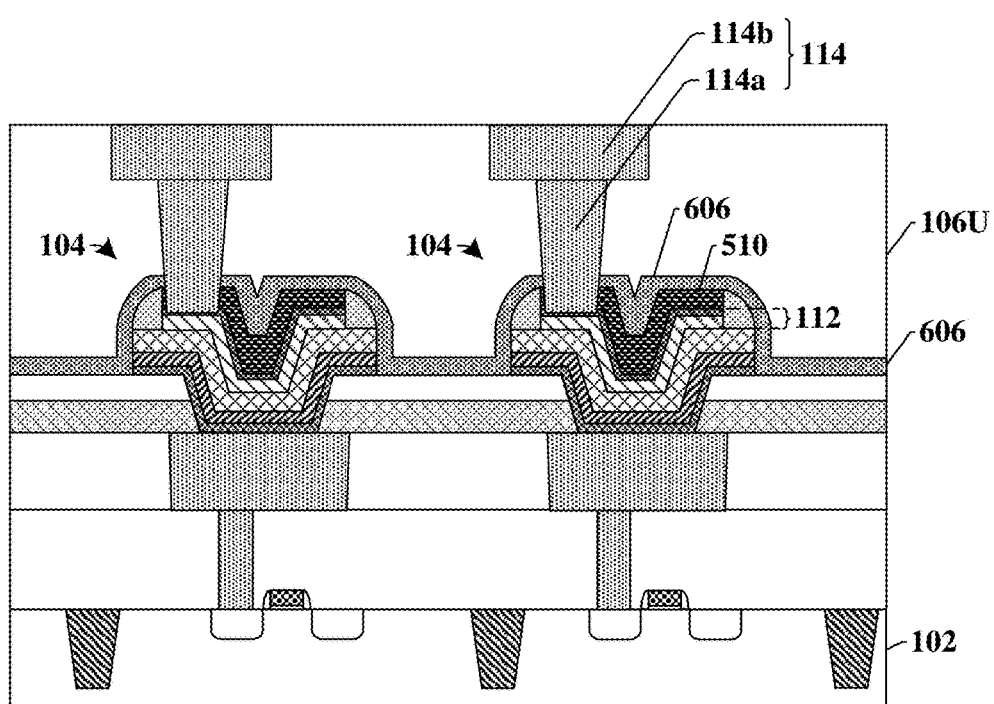

As shown in cross-sectional view 3300 of FIG. 33, an upper interconnect structure 114 is formed in the upper ILD layer 106U. In some embodiments, the upper interconnect structure 114 may comprise an interconnect via 114a (e.g., a top electrode via (TEVA)) and an interconnect wire 114b.

Figure 34:
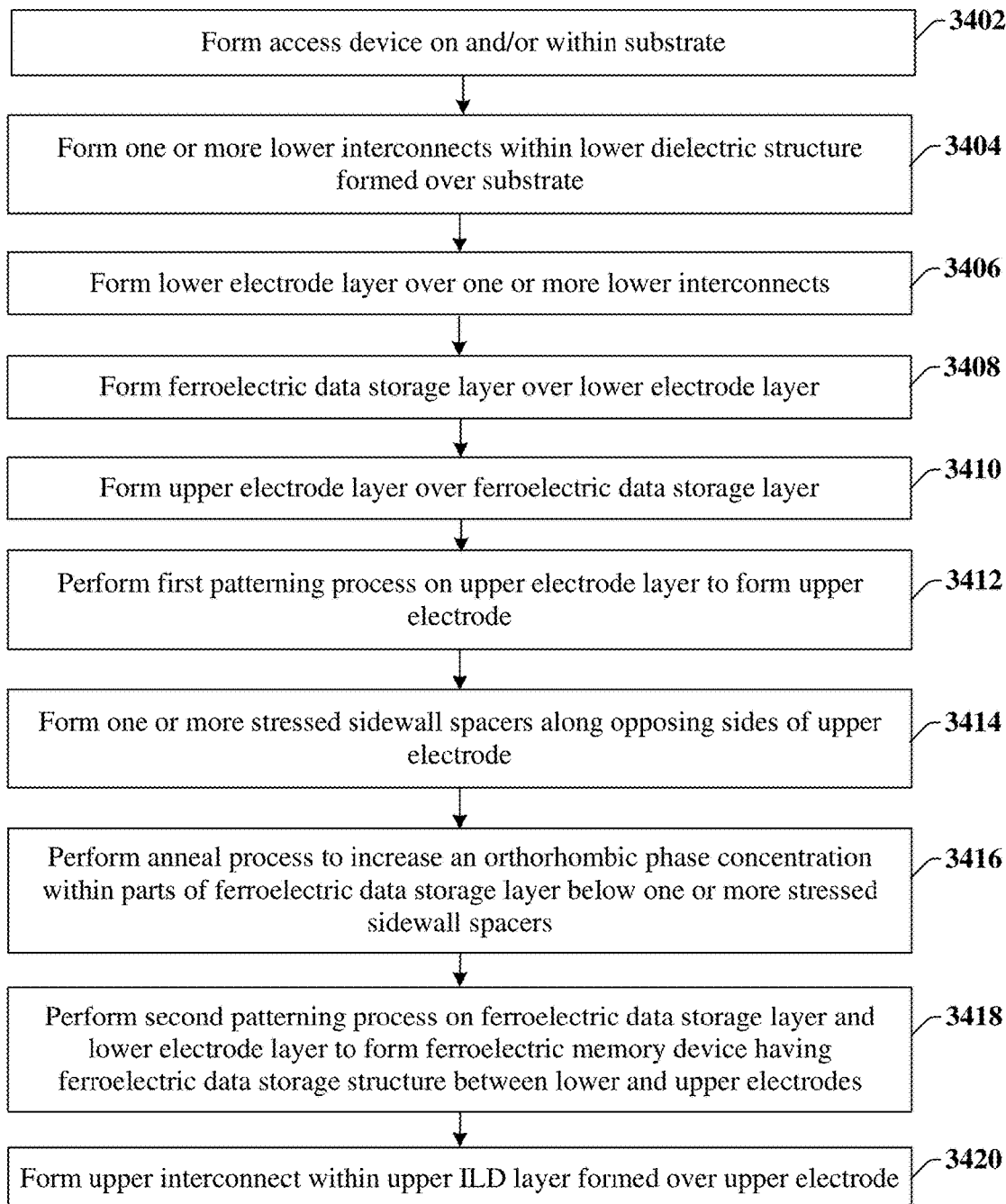
FIG. 34 illustrates a flow diagram of some embodiments of a method of forming an IC having a ferroelectric memory device including one or more stressed sidewall spacers configured to affect an orthorhombic phase concentration within a ferroelectric data storage structure.

FIG. 34 illustrates a flow diagram of some embodiments of a method 3400 of forming an integrated chip having a ferroelectric memory device including one or more stressed sidewall spacers configured to affect an orthorhombic phase concentration within a ferroelectric data storage structure.

While method 3400 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 3402, an access device is formed on and/or within a substrate. FIG. 11 illustrates a cross-sectional view 1100 of some embodiments corresponding to act 3402. FIG. 23 illustrates a cross-sectional view 2300 of some alternative embodiments corresponding to act 3402.

At act 3404, one or more lower interconnects are formed within a lower dielectric structure formed over the substrate. FIG. 12 illustrates a cross-sectional view 1200 of some embodiments corresponding to act 3404. FIG. 24 illustrates a cross-sectional view 2400 of some alternative embodiments corresponding to act 3404.

At act 3406, a lower electrode layer is formed over the one or more lower interconnects. FIG. 15 illustrates a cross-sectional view 1500 of some embodiments corresponding to act 3406. FIG. 26 illustrates a cross-sectional view 2600 of some alternative embodiments corresponding to act 3406.

At act 3408, a ferroelectric data storage layer is formed over the lower electrode layer. FIG. 15 illustrates a cross-sectional view 1500 of some embodiments corresponding to act 3408. FIG. 26 illustrates a cross-sectional view 2600 of some alternative embodiments corresponding to act 3408.

At act 3410, an upper electrode layer is formed over the ferroelectric data storage layer. FIG. 15 illustrates a cross-sectional view 1500 of some embodiments corresponding to act 3410. FIG. 26 illustrates a cross-sectional view 2600 of some alternative embodiments corresponding to act 3410.

At act 3412, a first patterning process is performed on the upper electrode layer to form an upper electrode. FIG. 17 illustrates a cross-sectional view 1700 of some embodiments corresponding to act 3412. FIG. 28 illustrates a cross-sectional view 2800 of some alternative embodiments corresponding to act 3412.

At act 3414, one or more stressed sidewall spacers are formed along opposing sides of upper electrode. FIG. 18A illustrates a cross-sectional view 1800 of some embodiments corresponding to act 3414. FIG. 29 illustrates a cross-sectional view 2900 of some alternative embodiments corresponding to act 3414.

At act 3416, an anneal process is performed to increase an orthorhombic phase concentration (e.g., a polar orthorhombic phase concentration) of the ferroelectric data storage layer below one or more stressed sidewall spacers. FIG. 19 illustrates a cross-sectional view 1900 of some embodiments corresponding to act 3416. FIG. 30 illustrates a cross-sectional view 3000 of some alternative embodiments corresponding to act 3416.

At act 3418, a second patterning process is performed on the ferroelectric data storage layer and the lower electrode layer to define a ferroelectric memory device having a ferroelectric data storage structure disposed between a lower electrode and the upper electrode. FIG. 20 illustrates a cross-sectional view 2000 of some embodiments corresponding to act 3418. FIG. 31 illustrates a cross-sectional view 3100 of some alternative embodiments corresponding to act 3418.

At act 3420, an upper interconnect is formed within an upper ILD structure formed over the ferroelectric memory device. FIG. 22 illustrates a cross-sectional view 2000 of some embodiments corresponding to act 3420. FIG. 33 illustrates a cross-sectional view 3100 of some alternative embodiments corresponding to act 3420.

Accordingly, in some embodiments, the present disclosure relates to an integrated chip having a ferroelectric memory device including one or more stressed sidewall spacers configured to increase an orthorhombic phase concentration (e.g., a polar orthorhombic phase) within a ferroelectric data storage structure.

In some embodiments, the present disclosure relates to an integrated chip. The integrated chip includes a lower electrode disposed within a dielectric structure over a substrate; a ferroelectric data storage structure disposed over the lower electrode; an upper electrode disposed over the ferroelectric data storage structure; and one or more stressed sidewall spacers arranged on opposing sides of the upper electrode, the ferroelectric data storage structure having an orthorhombic phase concentration that varies from directly below the one or more stressed sidewall spacers to laterally outside of the one or more stressed sidewall spacers. In some embodiments, the one or more stressed sidewall spacers have a tensile stress that is in a range of between approximately 100 MPa (megapascals) and approximately 900 MPa. In some embodiments, the one or more stressed sidewall spacers include silicon nitride or silicon carbon nitride. In some embodiments, the ferroelectric data storage structure has a maximum orthorhombic phase of greater than 75% directly below the one or more stressed sidewall spacers. In some embodiments, the ferroelectric data storage structure includes a polar orthorhombic phase and a non-polar orthorhombic phase, a concentration of the polar orthorhombic phase being greater than a concentration of the non-polar orthorhombic phase directly below the one or more stressed sidewall spacers. In some embodiments, the orthorhombic phase concentration of the ferroelectric data storage structure is larger directly below the one or more stressed sidewall spacers than directly below the upper electrode. In some embodiments, the one or more stressed sidewall spacers are disposed over a topmost point of the ferroelectric data storage structure. In some embodiments, the one or more stressed sidewall spacers extend to within one or more recesses in an upper surface of the ferroelectric data storage structure.

In other embodiments, the present disclosure relates to an integrated chip. The integrated chip includes one or more lower interconnects arranged within a dielectric structure over a substrate; a lower electrode disposed over the one or more lower interconnects; a ferroelectric data storage structure disposed on the lower electrode; an upper electrode disposed on the ferroelectric data storage structure; one or more stressed sidewall spacers arranged on opposing sides of the upper electrode, the one or more stressed sidewall spacers having a tensile stress; and the ferroelectric data storage structure having a central region directly below the upper electrode and one or more peripheral regions directly below the one or more stressed sidewall spacers, the one or more peripheral regions having first polar orthorhombic phase concentration that is higher than a second polar orthorhombic phase concentration within the central region. In some embodiments, the first polar orthorhombic phase concentration is more than 30% larger than the second polar orthorhombic phase concentration. In some embodiments, the first polar orthorhombic phase concentration within the one or more peripheral regions is higher than a second non-polar orthorhombic phase concentration within the one or more peripheral regions. In some embodiments, the first polar orthorhombic phase concentration is greater than approximately 75% and the second polar orthorhombic phase concentration is greater than approximately 40%.

In yet other embodiments, the present disclosure relates to a method of forming an integrated chip. The method includes forming one or more lower interconnects within a lower dielectric structure formed over a substrate; forming a lower electrode layer over the one or more lower interconnects; forming a ferroelectric data storage layer over the lower electrode layer; forming an upper electrode over the ferroelectric data storage layer; forming one or more stressed sidewall spacers along opposing sides of the upper electrode; and performing an anneal process after forming the one or more stressed sidewall spacers to increase an orthorhombic phase concentration within parts of the ferroelectric data storage layer. In some embodiments, the method further includes patterning the lower electrode layer and the ferroelectric data storage layer after performing the anneal process to form a lower electrode that is separated from the upper electrode by a ferroelectric data storage structure. In some embodiments, the anneal process increases the orthorhombic phase concentration within the parts of the ferroelectric data storage layer by between approximately 100% and approximately 1000%. In some embodiments, the anneal process increases a polar orthorhombic phase concentration within the parts the ferroelectric data storage layer by a first amount that is larger than a second amount by which a non-polar orthorhombic phase concentration is increased within the parts of the ferroelectric data storage layer. In some embodiments, the anneal process increases the orthorhombic phase concentration within a central region of the ferroelectric data storage layer by a first amount and further increases the orthorhombic phase concentration within one or more peripheral regions of the ferroelectric data storage layer by a second amount that is larger than the first amount. In some embodiments, the orthorhombic phase concentration within a central region of the ferroelectric data storage layer is greater than the orthorhombic phase concentration within one or more peripheral regions of the ferroelectric data storage layer prior to performing the anneal process; and the orthorhombic phase concentration within the central region of the ferroelectric data storage layer is smaller than the orthorhombic phase concentration within the one or more peripheral regions of the ferroelectric data storage layer after performing the anneal process. In some embodiments, the ferroelectric data storage layer has a central region laterally surrounded by one or more peripheral regions, the orthorhombic phase concentration of the central region being smaller than the orthorhombic phase concentration of the one or more peripheral regions after performing the anneal process. In some embodiments, the ferroelectric data storage layer has a central region laterally surrounded by one or more peripheral regions, wherein performing the anneal process reduces a variation in the orthorhombic phase concentration between the central region and the one or more peripheral regions.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip, comprising:
  a lower electrode;
  a high-k material structure disposed over the lower electrode;
  an upper electrode disposed over a central region of the high-k material structure; and
  a stressed dielectric spacer arranged on a peripheral region of the high-k material structure, wherein the high-k material structure has an orthorhombic phase concentration that varies between the central region and the peripheral region.

2. The integrated chip of claim 1, wherein the stressed dielectric spacer physically contacts the high-k material structure along an interface that extends both vertically and horizontally.

3. The integrated chip of claim 1, wherein the orthorhombic phase concentration increases from the central region of the high-k material structure to the peripheral region of the high-k material structure.

4. The integrated chip of claim 1, wherein the stressed dielectric spacer has a stress with a magnitude of between approximately 100 MPa (megapascals) and approximately 1000 MPa.

5. The integrated chip of claim 1, wherein the orthorhombic phase concentration within the peripheral region has a maximum orthorhombic phase concentration of greater than approximately 70%.

6. The integrated chip of claim 1, wherein at least a part of the central region of the high-k material structure is recessed below the peripheral region of the high-k material structure.

7. A device, comprising:
  a bottom electrode;
  a ferroelectric layer disposed on the bottom electrode;
  a top electrode disposed on the ferroelectric layer; and
  a spacer layer disposed on the ferroelectric layer and adjacent to the top electrode, wherein the ferroelectric layer has a higher concentration of orthorhombic phase within an edge region than within a central region.

8. The device of claim 7, wherein the ferroelectric layer further comprises non-zero concentrations of a tetragonal phase and a monoclinic phase, the non-zero concentrations of the tetragonal phase and the monoclinic phase being lower than a concentration of the orthorhombic phase within the ferroelectric layer.

9. The device of claim 7, wherein a maximum orthorhombic phase concentration within the edge region is more than 30% larger than a maximum orthorhombic phase concentration within the central region.

10. The device of claim 7, wherein a concentration of the orthorhombic phase within the central region is greater than approximately 40%.

11. The device of claim 7, wherein the spacer layer is configured to induce an increase of the orthorhombic phase within parts of the ferroelectric layer.

12. The device of claim 7, wherein the spacer layer comprises nitrogen.

13. The device of claim 7, wherein the ferroelectric layer has interior sidewalls forming a recess, the top electrode being arranged laterally and directly between the interior sidewalls of the ferroelectric layer.

14. The device of claim 7, wherein the spacer layer comprises a silicon nitride material having a refractive index of less than approximately 1.9 as measured at 633 nm.

15. A method of forming an integrated chip (IC), comprising:
forming a lower electrode layer;
forming a ferroelectric layer over the lower electrode layer;
forming an upper electrode over the ferroelectric layer;
forming a spacer onto the ferroelectric layer and adjacent to the upper electrode;
patterning the ferroelectric layer and the lower electrode layer outside of the upper electrode and the spacer to form a ferroelectric data storage structure and a lower electrode; and
wherein the ferroelectric data storage structure has a higher concentration of orthorhombic phase within a peripheral region that is directly below the spacer than within a central region.

16. The method of claim 15, further comprising:
forming a lower insulating structure over a substrate;
forming the lower electrode layer between sidewalls of the lower insulating structure;
performing a planarization process to remove a part of the lower electrode layer from over the lower insulating structure; and
forming the ferroelectric layer onto the lower electrode layer after performing the planarization process.

17. The method of claim 16, wherein the spacer comprises a silicon nitride material formed by a vapor deposition technique that uses reacting gases including a silane gas and an ammonia gas.

18. The method of claim 17, wherein the silane gas is introduced into a process chamber at a flow rate of between approximately 10 sccm (standard cubic centimeters per minute) and approximately 100 sccm.

19. The method of claim 17, wherein a ratio of the ammonia gas to the silane gas is between approximately 0.8 and approximately 3.

20. The method of claim 17, wherein the vapor deposition technique is performed at a power that is in a range of between approximately 10 Watts (W) and approximately 250 W, at a pressure of between approximately 3 torr and approximately 6 torr, and at a temperature of between approximately 200° Celsius (C) and approximately 400° C.

* * * * *